United States Patent [19]
Nakamura et al.

[11] Patent Number: 5,847,418
[45] Date of Patent: Dec. 8, 1998

[54] SEMICONDUCTOR PHOTO DETECTOR CONTAINING CRYSTALLINE AMPLIFICATION LAYER

[75] Inventors: Takeshi Nakamura; Shinya Kyozuka; Takayuki Yamada; Yasuaki Miyamoto, all of Ebina, Japan

[73] Assignee: Fuji Xerox Co., Ltd., Tokyo, Japan

[21] Appl. No.: 739,198

[22] Filed: Oct. 30, 1996

[30] Foreign Application Priority Data

Dec. 28, 1995 [JP] Japan .................................... 7-343314
Mar. 29, 1996 [JP] Japan .................................... 8-075933

[51] Int. Cl.$^6$ .......................... H01L 31/0328; H01L 29/15
[52] U.S. Cl. .............................. 257/186; 257/16; 257/21; 257/22; 257/75; 257/77
[58] Field of Search ................................. 257/16, 21, 22, 257/75, 77, 186, 438

[56] References Cited

U.S. PATENT DOCUMENTS

| | | | |
|---|---|---|---|
| 5,453,629 | 9/1995 | Gofuku et al. | 257/186 |
| 5,481,124 | 1/1996 | Kozuka et al. | 257/186 |

FOREIGN PATENT DOCUMENTS

| | | |
|---|---|---|
| A-2-34977 | 2/1990 | Japan . |
| A-3-253082 | 11/1991 | Japan . |

OTHER PUBLICATIONS

IEEE Transactions on Electron Devices, vol. 35, No. 8, Aug. 1988, "Amrphous Silicon/Silicon Carbide Superlattice Avalanche Photodiodes", JWO et al., pp. 1279–1283.

ITE'95: 1995 ITE Annual Convention, Annual Meeting Preprint of the Television Society, "Photocurrent Multiplication of a Si:H Staircase Photodiodes", Sawada et al., pp. 73–74.

*Primary Examiner*—Gene M. Munson
*Attorney, Agent, or Firm*—Oliff & Berridge, PLC

[57] ABSTRACT

Described is a semiconductor photo detector comprising, between a lower electrode and an upper electrode, an optical absorption layer which generates photo carriers, receiving light and an amplification layer which amplifies the photo carriers so generated. In the semiconductor photo detector, the amplification layer is formed of a well layer which causes an avalanche phenomenon and a barrier layer which has a band gap larger than that of the optical absorption layer. The well layer is formed of a crystal substance, by which at the interface with the barrier layer, the energy value of the conduction band of the photo carriers in the well layer is lower than that in the barrier layer and at the same time, the difference in the energy value of the conduction band between the well layer and the barrier layer is larger than the band gap between the valence band and the conduction band of the well layer.

10 Claims, 11 Drawing Sheets

SEMICONDUCTOR PHOTO DETECTOR CONTAINING CRYSTALLINE AMPLIFICATION LAYER

BACKGROUND OF THE INVENTION

1. Field of the Invention

This invention relates to a semiconductor photo detector for use in a line image sensor for image reading of a copying machine, facsimile or the like, or for use in a two-dimensional image sensor for image input of a video camera or the like, particularly to a semiconductor photo detector making use of an avalanche effect for amplifying optically-formed carriers by impact ionization.

2. Description of the Related Art

As a device for reading light in a visible light range, CCD has been widely employed. A thin-film type image sensor using a semiconductor thin-film has also been proposed and it has already been industrialized in some fields. These photo detectors make use of a photo diode as a light-sensing part. They form, in principle, one or less than one electron for one light quantum and have no amplification effect. In general, it has been widely employed to equip a photo detector with an external amplification circuit, by which amplification of electrons is conducted to improve the sensitivity. According to this method, a noise component in the photo detecting part is also amplified at the same time, which inevitably leads to the lowering in the SN ratio. Such a detector is therefore accompanied with the drawback that in order to obtain a clear image using the detector, image pickup should be conducted after applying strong light to the object to be read for preparing the conditions under which sufficient reflected light is available.

With a view to overcoming the above-described drawback, a detector capable of conducting highly-sensitive image pickup by employing a semiconductor film made of crystal Si, Se or the like and imparting the photo-detecting part with an amplification effect has been industrialized in recent years. In this detector, a high electric field is applied to a semiconductor film made of crystal Si, Se or the like, whereby avalanche amplification (avalanche effect) is conducted. A Photo diode making use of an avalanche amplification effect (said diode will hereinafter be abbreviated as "APD") is now attracting attentions as a highly-sensitive semiconductor photo detector which can detect feeble light.

As this APD, there exists, as illustrated in FIG. 12(a), a single crystal Si pin APD comprising an $n^-$ electrode 201 made of silicon to which impurities have been doped, an $SiO_2$ layer 202, an $n^+$ layer 203, a p layer 204 which will be an avalanche region, a $p^-$ layer 205 which will be an optical absorption region, a $p^+$ substrate 206 and a $p^-$ electrode 207 made of silicon to which impurities have been doped.

FIG. 12(b) is a schematic view illustrating the band structure of the above-described APD at the time when reverse bias is applied. The incident light irradiated from the side of the $n^-$ electrode 201 is absorbed by the $p^-$ layer 205 (which will be an optical absorption layer), whereby photoelectric transfer is conducted. Of an electron-hole pair formed in the $p^-$ layer 205, the electron travel toward the $n^-$ electrode 201 and the hole travel toward the $p^-$ electrode 207, respectively. The p layer 204 (which will be a carrier multiplication layer) has a strong electric field so that there appears an avalanche phenomenon, that is the phenomenon forming a large number of electron-hole pairs by the impact ionization during traveling of electrons, leading to the occurrence of a multiplication effect for forming a plurality of electron-hole pairs per one photo quantum.

The multiplication factor at this time depends on the ionization rate $\alpha$ of electrons. The larger the $\alpha$ is, the higher multiplication factor can be obtained. The term "ionization rate $\alpha$" as used herein means the number of electron-hole pairs formed at the time when one electron travels for a unit distance by impact ionization. The ionization rate d shows an exponential increase with an increase in the strength of the electric field so that the larger multiplication factor can be obtained by increasing the electric field.

The single crystal Si pin APD has been industrialized as a highly-sensitive semiconductor photo detector which has sensitivity to a range of from visible light to near infrared light ($\lambda$=0.45–1.0 $\mu$m) and can detect even feeble incident light. It is, however, accompanied with the following drawbacks:

(1) it requires a high driving voltage (~100V) because a high electric field is applied by the externally applied voltage to cause impact ionization of carriers;

(2) owing to the operation in the high electric field, leakage current (dark current) generated at the time when no light is irradiated is large; and (3) avalanche amplification is accompanied with the occurrence of noise (excess noise), which lowers a signal to noise ratio (SN ratio).

According to the report of R. J. McIntyre in "IEEE Transactions Electron Device, 13, 164(1966)", it has been elucidated that when the ionization rate of electrons and that of holes are designated as $\alpha$ and $\beta$, respectively, the excess noise generated during the above-described avalanche multiplication depends on the ratio of these ionization rates (impact ionization coefficient ratio) $k=\beta/\alpha$, and in order to decrease the excess noise, the ratio k may be lowered for the electron multiplication while it may be raised for the hole multiplication, in other words, only the ionization rate of one of the carriers (electron or hole) to be multiplied may be increased.

In the case of single crystal Si, the ionization rate d of electrons is much larger than the ionization rate d of holes so that it is necessary to increase only the $\alpha$ to decrease the excess noise. In the single crystal Si pin APD, however, the ionization rate $\alpha$ of electrons and ionization rate $\beta$ of holes are determined according to the electric field strength of the avalanche region so that it is impossible to control the values of $\alpha$ and $\beta$ independently and the larger the electric field strength, the larger the value of k. In other words, as the electric field strength is heightened to obtain a larger multiplication ratio, the excess noise increases, inevitably leading to the reduction in an SN ratio.

The above-described report further describes that when only one of the carriers is multiplied, the excess noise index F becomes 2. In the case of ideal, noise-free multiplication, the index F may be 1 so that there remains somewhat noise generating mechanism in the above case. It is considered as the generating mechanism that the place where ionization occurs fluctuates within a semiconductor photo detector so that the whole multiplication factor fluctuates, in other words, the fluctuation becomes a noise source. It is considered that to suppress the fluctuation and to obtain a higher SN ratio, specification of the place where ionization occurs within the detector is effective.

With a view to overcoming the above-described problems of the single crystal Si-base pin APD, APD using a super-lattice structure of an amorphous Si semiconductor is proposed in "IEEE Trans. Electron Devices, 35, 1279(1988)". A description will next be made of this APD, with reference to FIGS. 13 (a)–(c).

The APD using a super-lattice structure of an amorphous Si-base semiconductor comprises, as illustrated in FIG.

13(a), a transparent electrode 302 made of ITO, a p+a-Si:H layer 303, a super lattice layer 306 serving as both an optical absorption layer and a carrier multiplication layer, an n+a-Si:H layer 307 and an electrode 308 formed of Al, all of them being stacked one after another on a glass substrate 301. The super-lattice layer 306 is formed of an a-Si:H layer 304 which will be a well layer and an a-SiC:H layer 305 which will be a barrier layer, said layers being stacked alternately to be 10 layers in total. Concerning the p+a-Si:H layer 303 and the transparent electrode 302, and the n+a-Si:H layer 307 and the electrode 308, each pair is constructed to form an ohmic contact.

FIG. 13(b) is a schematic view illustrating the band structure of the above-described APD at the time when no voltage is applied. In the diagram, discontinuous amounts of the energy band of the conduction band and valence band in the hetero junction between a-Si:H and a-SiC:H are expressed by $\Delta Ec$ and $\Delta Ev$, respectively. Concerning the band discontinuous amount in the a-Si:H/a-SiC:H hetero junction, that of the conduction band is larger, and $\Delta Ec$ is 0.35 eV and $\Delta Ev$ is 0.10 eV.

FIG. 13(c) is a schematic view illustrating the band structure of the above-described APD at the time when reverse bias is applied. The incident light from the side of the p+a-Si:H layer 303 is absorbed by the super-lattice layer 306, whereby optoelectric transfer is conducted and a pair of electron and hole is formed. The electron and hole so formed travel toward the n+a-Si:H layer 307 and the p+a-Si:H layer 303, respectively. When the electron accelerated by the electric field enters into the well layer 304 from the barrier layer 305 of the super lattice layer 306, its energy condition becomes higher by $\Delta Ec$, that is, the band discontinuous amount of the conduction band, which heightens the ionization rate d of the electron in proportion. Repetition of the above-described procedure of the electron increases the number of the carriers.

In the case of the hole, on the other hand, no such phenomenon occurs because the band discontinuous amount $\Delta Ev$ of the valence band is small. According to the above-described APD structure, only the ionization rate $\alpha$ of the electron can be increased and furthermore, the place where ionization occurs can be specified at the hetero junction part so that high sensitivity and low excess-noise properties can be attained. In addition, carriers receive energy by the band offset of the hetero structure so that the electric field strength necessary for the ionization of carriers can be reduced, which enables low voltage drive.

In the report by Sawada et al., in "Annual Meeting Preprint of the Television Society, 1995, p73", described is an APD having a graded super-lattice structure in which in an a-Si:H/a-SiC:H super lattice, a barrier layer has a saw-tooth potential structure. A description will next be made of this APD with reference to FIGS. 14(a)–(c).

The APD having a graded super-lattice structure is formed of an i-type a-Si:H 402, a graded super-lattice layer 405 serving as an optical absorption layer and a carrier multiplication layer, i-type a-Si:H 406, a p-type semiconductor layer 407 and a transparent electrode 408 made of Au, all of them being stacked one after another on an n-type single crystal Si substrate 401. The graded super-lattice layer 405 is constructed of an i-type a-Si:H layer 404 which will be a well layer and an i-type a-Si$_{1-x}$C$_x$:H (x=0–1) layer 403 which will be a barrier layer, said layers being stacked alternately to 6 layers in total.

FIG. 14(b) is a schematic view illustrating the band structure of the above-described APD at the time when no voltage is applied. The band structure of the graded super-lattice can be changed to a saw-tooth structure by continuously changing the composition ratio of the a-Si$_{1-x}$C$_x$:H layer within a range of x=0–1 at the time when the i-type a-Si$_{1-x}$C$_x$:H (x=0–1) layer 403 is deposited as a barrier layer.

FIG. 14(c) is a schematic view illustrating the band structure of the above-described APD at the time when reverse bias is applied. The avalanche multiplication mechanism is fundamentally equal to that of the super-lattice APD illustrated in the above FIG. 13. In this diode, however, there does not exist an energy barrier against electrons at the hetero junction part in the traveling direction of electrons, which makes it possible to avoid cooling of electrons by which energy is lost at the time when electrons enter from the well layer 404 to the barrier layer 403, or to prevent electrons from not being taken externally as signals owing to the accumulation of electrons in the well layer 404. It is therefore possible to conduct a sensitivity increase and reduction in noise furthermore.

The APD which employs the super-lattice structure of an amorphous Si-base semiconductor is however accompanied with the problem that it uses an amorphous semiconductor as the carrier multiplication layer so that electrons generated are trapped or form recombination in the film, leading to a large loss, and an amplification factor cannot be increased.

In the super-lattice APD of an amorphous Si base semiconductor, as the band discontinuous amount $\Delta Ec$ of the conduction band is about 0.34 eV, smaller than the forbidden band width Eg (1.70 eV) of the i-type a-Si:H which is the well layer 404, it is necessary to apply a high electric field to the carrier multiplication layer in order to cause an avalanche phenomenon. By this application of the high electric field, electron-hole pairs are formed from the local level in the carrier multiplication layer, leading to the problems that large dark current is formed and a high SN ratio is not available.

SUMMARY OF THE INVENTION

With the forgoing in view, the present invention has been completed. An object of the present invention is to provide a semiconductor photo detector having a high amplification factor at low driving voltage by using a thin-film semiconductor which enables a high amplification ratio and low voltage drive.

With a view to attaining the above object, the amplification layer for amplifying photo carriers is constructed as follows: (i) an amplification layer is formed using a crystal substance and the mean free path of electrons is improved substantially at the time when electrons transfer within the amplification layer having improved film quality, whereby an improvement in the amplification factor is brought about; or (ii) the amplification layer is formed from a barrier layer and a well layer made of a crystal substance so that electrons receive energy at the interface therebetween, which makes it possible to improve the mean free path of electrons substantially, thereby bringing about an improvement in the amplification factor. The film quality of the amplification layer is improved by crystallizing the amplification layer wholly or partially.

Described specifically, the present invention corresponding to the above construction (i) is characterized by that in the semiconductor photo detector having, between a pair of electrodes, at least one of said electrodes having a light transmitting property, an optical absorption layer which generates photo carriers, receiving light, and an amplification layer which amplifies the photo carriers so generated, said amplification layer is formed of a crystal substance obtained by crystallizing an amorphous film after stacking the film.

The process for the fabrication of the above-described semiconductor photo detector is characterized by that it is equipped with a stacking step for stacking a pair of electrodes, an optical absorption layer and an amplification layer one after another, at least said amplification layer being stacked in an amorphous condition; and a crystallizing step for crystallizing said amplification layer in a high-temperature atmosphere subsequent to stacking of said amplification layer in said stacking step.

Another process for the fabrication of the above-described semiconductor photo detector is characterized by that it is equipped with a stacking step for stacking a pair of electrodes, an optical absorption layer and an amplification layer one after another, at least said amplification layer being stacked in an amorphous condition; and a crystallizing step for crystallizing said amplification layer by exposure to light, which is not absorbable by said optical absorption layer but absorbable by said amplification layer, subsequent to stacking of said amplification layer in said stacking step.

In the crystallizing step for crystallizing said amplification layer by exposure to light, it is preferred to conduct melting of the interfacial region of the optical absorption layer on the side of the amplification layer, together with crystallization of the amplification layer.

According to the above invention, it is possible to reduce the gap level of the material having a large band gap, thereby improving the film quality of the amplification layer by crystallizing the amplification layer formed of a semiconductor layer which amplifies electrons by making use of an avalanche phenomenon.

Described specifically, it is possible to substantially suppress the generation of electron-hole pairs in the amplification layer and to suppress the generation of the dark current by crystallizing the amplification layer to increase the band gap between the valence band and the conduction band and at the same time to lower the gap level.

Accordingly, it becomes possible to cause an avalanche phenomenon by applying a high electric field to the amplification layer, to attain an improvement in the amplification factor by substantially improving the mean free path of electrons to increase the electric current, and to decrease the voltage applied to the whole semiconductor photo detector for low voltage drive.

In addition, it becomes possible to melt the interfacial region between the optical absorption layer and the amplification layer by crystallization, thereby removing the intrastratum interfacial level, and to avoid accumulation of electrons generated by exposure to light and suppress the disappearance of electrons at the interfacial part, thereby bringing about an improvement in the amplification factor.

The present invention corresponding to the above-described (ii) has, in a semiconductor photo detector having, between a pair of electrodes, at least one of said electrodes having a light transmitting property, an optical absorption layer generating photo carriers, receiving light and an amplification layer which amplifies the photo carriers so generated, the following structure.

The amplification layer has a barrier layer having a band gap larger than that of the optical absorption layer and a well layer stacked contiguously on said barrier layer.

The well layer is formed of a crystal substance by which, at the interface with the barrier layer, the energy value of the conduction band of the photo carriers in the well layer is lower than that in the barrier layer and at the same time, the difference in the energy value of the conduction band of the photo carriers between the well layer and the barrier layer is larger than the band gap between the valence band and the conduction band of the well layer.

The process for the fabrication of the above-described semiconductor photo detector is characterized by that it is equipped with a stacking step for stacking a pair of electrodes, an optical absorption layer, a barrier layer and a well layer one after another, at least said well layer being stacked in an amorphous condition; and a crystallizing step for crystallizing said well layer in a high-temperature atmosphere subsequent to stacking of at least said well layer in the stacking step.

In the crystallizing step, the barrier layer and the well layer may be crystallized after stacking at least the barrier layer and well layer in an amorphous condition and then after the stacking step, exposing them to the light of a wavelength which is absorbable thereby.

Alternatively in the crystallizing step, the well layer may be crystallized after stacking at least the barrier layer and well layer in an amorphous condition and then after the stacking step, exposing them to light which is not absorbable by the barrier layer but is absorbable by the well layer.

According to the above-described invention, the well layer of the amplification layer which is formed of a semiconductor layer which amplifies electrons by making use of an avalanche phenomenon is formed of a crystal substance, whereby the gap level can be reduced and a high amplification factor can be attained even at low driving voltage and at low dark current.

Described specifically, the well layer is formed of a crystal substance having a small band gap so that at the interface between the well layer and the barrier layer, the energy value of the conduction band of the photo carriers in the well layer can be made lower than that in the barrier layer and the difference in the energy value of the conduction band of the photo carriers between the well layer and the barrier layer can be made larger than the band gap between the valence band and the conduction band of the well layer.

Electrons which are traveling from the barrier layer to the well layer receive, at the interfacial part therebetween, the energy corresponding to the difference of the conduction band and cause an avalanche phenomenon in the well layer. This energy which electrons receive at the interfacial part is made larger than the band gap between the valence band and the conduction band of the well layer so that the avalanche phenomenon can be caused only by this energy and low voltage drive can be conducted.

In other words, the film quality of the semiconductor thin film in the amplification layer composed of the barrier layer and the well layer can be improved substantially, an improvement in the amplification factor can be attained by substantially improving the mean free path of electrons, thereby increasing the electric current; and generation of electron-hole pairs from the semiconductor thin film can be substantially suppressed by low voltage drive.

The advantages of the present invention can be summarized as follows:

According to the present invention, the film quality of the semiconductor thin film which is an amplification layer can be improved largely, an improvement in the amplification factor can be attained by an increase in the electric current brought by a substantial improvement in the mean free path of electrons and generation of electron-hole pairs from the film can be suppressed substantially.

It therefore becomes possible to fabricate a semiconductor photo detector which enables a high amplification factor even at low applied voltage.

Accordingly, compared with an amplification means using a conventional external amplification circuit, it is possible to amplify signal charges with remarkably low noise and to attain size reduction and cost reduction of, for example, a high-speed and high-resolution image input system.

DETAILED DESCRIPTION OF THE PREFERRED EMBODIMENTS

Figure 1A:
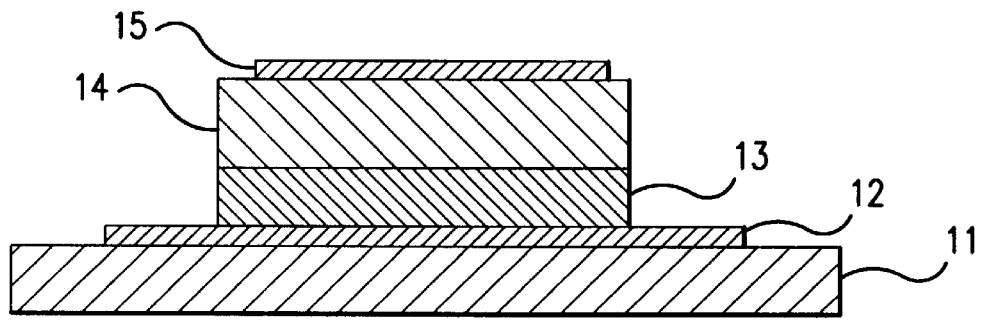
FIG. 1(a) is a schematic cross-sectional view illustrating the structure of the semiconductor photo detector according to the present invention, 1(b) is an energy band diagram illustrating the band structure of the interfacial part between the optical absorption layer and the amplification layer of the semiconductor photo detector, and 1(c) is an energy band diagram illustrating the band structure of the semiconductor photo detector at the time when reverse bias is applied.

A description will next be made of one embodiment [corresponding to the construction described in the above (i)] of the semiconductor photo detector relating to this invention, with reference to its structure and band structure in FIGS. 1(a)–(c). FIG. 1(a) is a cross-sectional view illustrating the structure of the semiconductor photo detector according to the present invention, FIG. 1(b) is a schematic view illustrating the band structure at the interfacial part between an optical absorption layer and an amplification layer of the semiconductor photo detector, and FIG. 1(c) is a schematic view illustrating the band structure of the semiconductor photo detector at the time when reverse bias is applied.

The semiconductor photo detector according to the present invention is formed by stacking a lower electrode 12, an optical absorption layer 13, an amplification layer 14 and an upper electrode 15 one after another on an insulating substrate 11. The optical absorption layer 13 is a layer forming photo carriers, receiving light. The photo carriers generated by the optical absorption layer 13 are amplified by the amplification layer 14. The amplification layer 14 is formed of a crystal substance obtained by crystallizing an amorphous film after stacking it. In this embodiment, light is irradiated downwards so that the upper electrode 15 is formed of a light transmitting material.

The amplification layer 14 is crystallized by exposure to laser light from an excimer laser or the like or crystallized in a high-temperature atmosphere such as infrared-ray lamp annealing or the like. By the crystallization, the gap level (local level density) of the amplification layer 14 which amplifies electrons by making use of an avalanche effect can be reduced to the level free from practical problems even if a material having a large band gap is selected for the amplification layer.

Figure 1B:
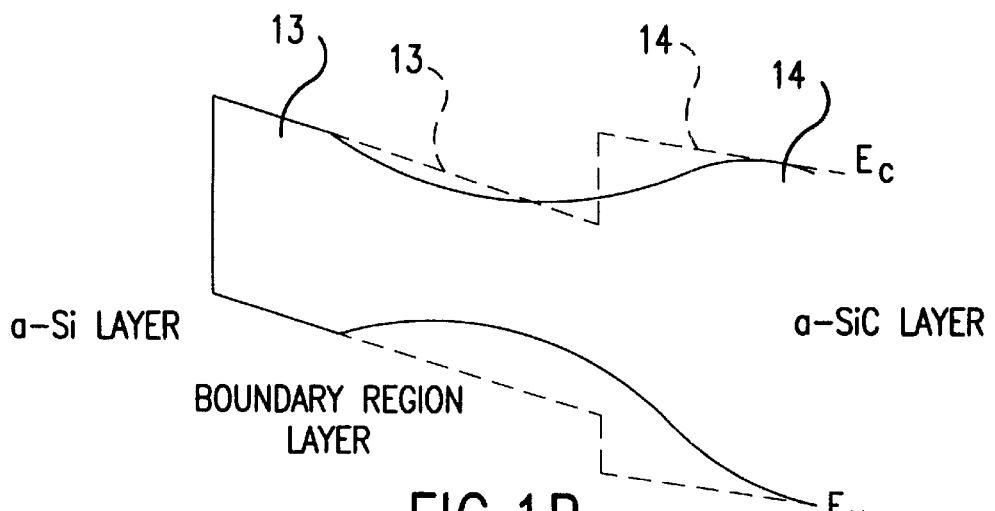
Figure 1C:
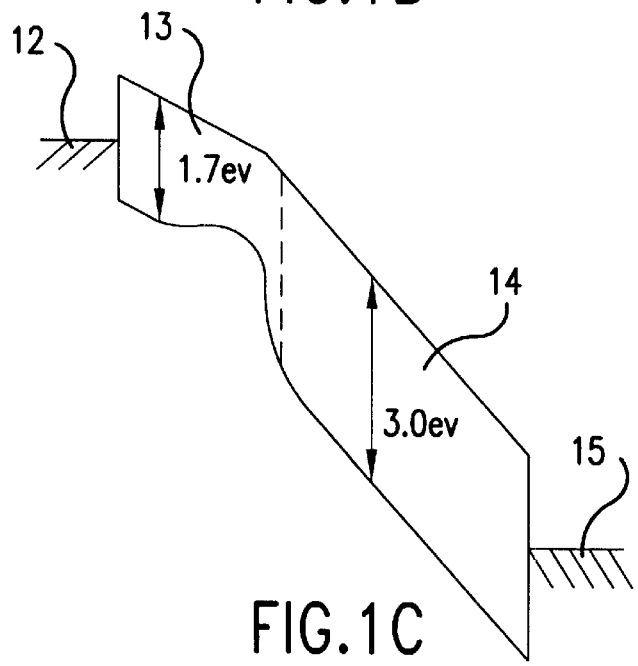

By crystallizing the amplification layer 14, the interfacial part between the amplification layer 14 and the optical layer 13 is molten during the crystallizing step of the amplification layer 14 and atoms from the amplification layer 14 and the optical absorption layer 13 diffuse properly in the interfacial region and form an interface so that a change in the band becomes continuous [FIG. 1(b)]. By melting in addition to crystallization, a definite surface region disappears, whereby the surface level which otherwise becomes a recombination center substantially disappears. Accordingly, the band structure at the time when reverse bias voltage is applied shows a downward monotonous inclination as shown in FIG. 1(c) so that when the photo carriers formed by the optical absorption layer 13 travel, they can travel smoothly without loss of electrons caused by the energy barrier, whereby accumulation, at the interfacial part, of electrons generated by exposure to light can be avoided, disappearance of electrons at the interfacial part, which has so far been a problem, can be suppressed and a substantial improvement in the amplification factor can be attained.

In the above construction, a material having a large band gap can be employed as the amplification layer 14 so that the generation of dark current, at the time when reverse bias voltage is applied, caused by the electric field other than the avalanche amplification can be suppressed. In addition, by the crystallization of the amplification layer 14, the gap level (local level density) at the time when reverse bias voltage is applied can be reduced to a level free from the practical problems and the formation of electrons which will be a cause for the dark current can be suppressed. As a result, a high amplification factor can be obtained at low driving voltage and low dark current in the semiconductor photo detector.

Figure 8A:
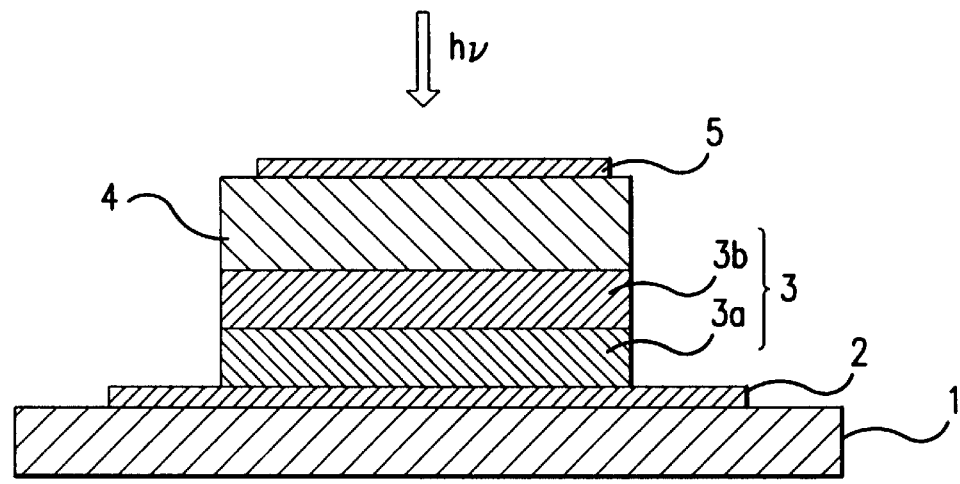
FIG. 8(a) is a schematic cross-sectional view illustrating the structure of the semiconductor photo detector according to the present invention, 8(b) is an energy band diagram illustrating the band structure of the semiconductor photo detector at the time when no voltage is applied, and 8(c) is an energy band diagram illustrating the band structure of the semiconductor photo detector at the time when reverse bias is applied.

A description will next be made of another embodiment [corresponding to the construction described in the above (ii)] of the semiconductor photo detector relating to this invention, with reference to the structure and band structures in FIGS. 8(a)–(c). FIG. 8(a) is a cross-sectional view illustrating the structure of the semiconductor photo detector according to the present invention, FIG. 8(b) is a schematic view illustrating the band structure of the semiconductor photo detector at the time when no voltage is applied, and FIG. 8(c) is a schematic view illustrating the band structure of the semiconductor photo detector at the time when reverse bias is applied.

The semiconductor photo detector according to this invention is formed by stacking a lower electrode 2, an amplification layer 3, an optical absorption layer 4 and a upper electrode 5 one after another on an insulating substrate 1. The optical absorption layer 4 is a layer generating photo carriers, receiving light. The photo carriers so generated by the optical absorption layer 4 are amplified by the amplification layer 3. The amplification layer 3 is formed of a well layer 3a positioned on the side of the electrode 2 and the barrier layer 3b positioned on the side of the optical absorption layer 4. In this embodiment, the upper electrode 5 is formed of a light transmitting material because light is irradiated downwards.

Figure 8B:
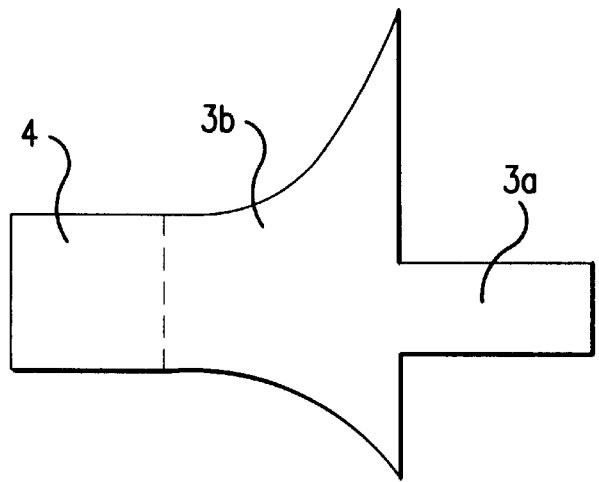
Figure 8C:
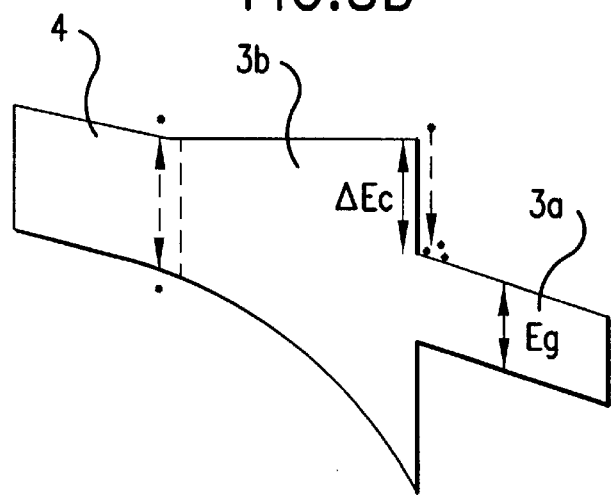

The barrier layer 3b is, as illustrated in FIG. 8(b), has a band gap larger than that of the optical absorption layer 4. The barrier layer is constituted so that by continuously changing the composition ratio of the material forming the barrier layer 3b, the band gap shows an increase from a value equal to that of the optical absorption layer 4 over a range from the side of the optical absorption layer 4 toward the side of the well layer 3a, and reaches the maximum value at the interface with the well layer 3a. In addition, when drive voltage is applied between the lower electrode 2 to the upper electrode 5 (when reverse bias is applied), the energy value of the conduction band of the barrier layer 3b shows, as illustrated in FIG. 8(c), a flat change or monotonous decrease toward the traveling direction of the photo carriers. This is because the photo carriers formed by the optical absorption layer 4 can travel in the barrier layer 3b smoothly without a loss of electrons by the energy barrier at the time when reverse bias is applied.

The structure of the present invention is characterized by that the well layer 3a of the amplification layer 3 is formed of a crystal substance such as substance, for example, poly-Si film, single crystal substance or micro-crystal substance. The well layer 3a formed of a crystal substance can be prepared by (i) stacking the material of a crystal substance as the well layer 3a, (ii) crystallizing an amorphous material in a high-temperature atmosphere after stacking it, (iii) crystallizing an amorphous material by exposure to laser after stacking it, or the like. As the above method (ii), the well layer 3a can be deposited, followed by crystallization or the well layer 3a and the barrier layer 3b can be deposited continuously, followed by crystallization of both layers. As the method (iii), the well layer 3a and the barrier layer 3b can be deposited continuously, followed by exposure to laser light of different wavelengths to crystallize only the well layer 3a or both the well layer 3a and the barrier 3b can be crystallized. Specific examples of the crystallization means for (ii) include infrared ray lamp annealing and furnace annealing, while those for (iii) include excimer laser and blue laser.

By forming the well layer 3a from a crystal substance having a small band gap, the energy value of the conduction band of the photo carriers in the well layer 3a at the interface with the barrier layer 3b can be set lower than that in the barrier layer 3b and at the same time, the difference $\Delta c$ in the energy value of the conduction band of the photo carriers between the well layer 3a and the barrier layer 3b can be set larger than the band gap (forbidden band width Eg) between the valence band and the conduction band of the well layer 3a.

According to this structure, the electrons which are traveling from the barrier layer 3b to the well layer 3a receive, at the interfacial part therebetween, the energy corresponding to the difference of the conduction band (potential energy is converted to the kinetic energy) and by the impact ionization to the lattice in the well layer 3a, they form electron-hole pairs and cause an avalanche phenomenon. At this time, the energy ($\Delta Ec$) which electrons receive at the interface is larger than the band gap (forbidden band width Eg) between the valence band and the conduction band of the well layer 3a so that only this energy is enough for causing the avalanche phenomenon.

According to the semiconductor photo detector having the above-described structure, the well layer 3a which amplifies electrons by making use of an avalanche effect is formed of a crystal substance having a small band gap so that it becomes possible to cause the avalanche phenomenon using only the energy ($\Delta Ec$) which electrons receive at the interface. No voltage application is required for the avalanche phenomenon so that the low drive voltage can be attained. When the reverse bias voltage is applied, the gap level can be reduced to the level free from practical problems, whereby the formation of electrons which become a cause for the dark current can be suppressed. As a result, in this semiconductor photo detector, a high amplification factor can be obtained at low driving voltage and low dark current.

Figure 2:
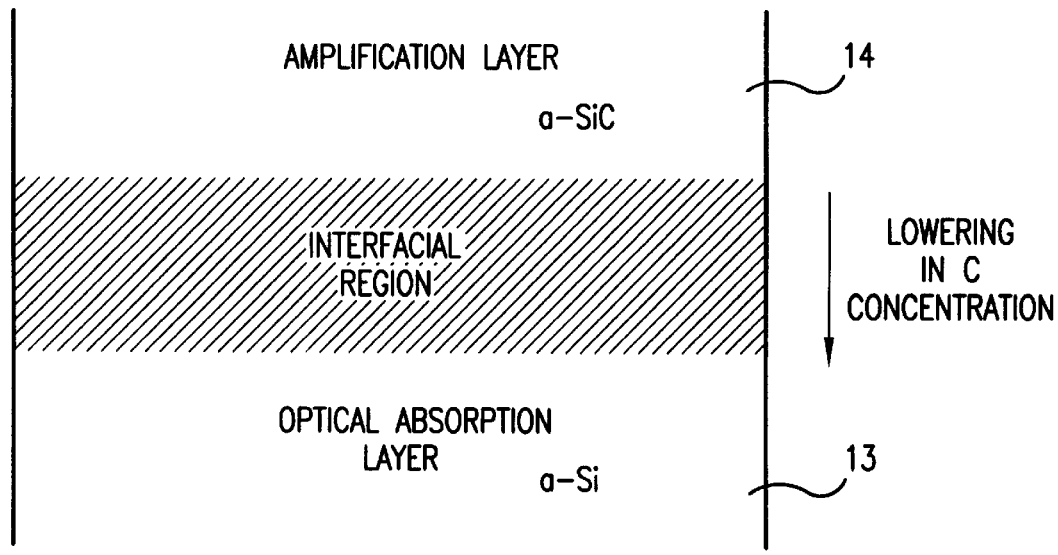
FIG. 2 is a schematic view illustrating the C concentration in the interface region between the optical absorption layer and the amplification layer of the semiconductor photo detector.

Furthermore, by stacking the well layer 3a and the barrier layer 3b each formed of an amorphous material and crystallizing both layers after stacking, the interfacial part therebetween is molten in the crystallizing step of the well layer 3a and electrons from the well layer 3a and barrier layer 3b diffuse properly in the interface region and form an interface, whereby a change in the energy band becomes continuous as shown in FIG. 2 at the interface. By melting in addition to crystallization, the definite interfacial region is lost, whereby the surface level which becomes a recombination center almost disappears.

It is therefore possible to suppress the disappearance of electrons at the interfacial part and to attain a substantial improvement in the amplification factor.

In the method where the well layer 3a and the barrier layer 3b each formed of an amorphous material are stacked one after another and then only the well layer 3a is exposed to laser for crystallization, somewhat diffusion appears at the interfacial part between the well layer 3a and the barrier layer 3b by exposure to light for melting. Even this method is more effective for suppressing the disappearance of electrons at the interfacial part than the method [described in (i)] where the material of a crystal substance is stacked as the well layer 3a.

A description will next be made of specific embodiments of the semiconductor photo detector of the present invention corresponding to the above-described constitution (i).

Embodiment 1

The semiconductor photo detector according to this embodiment is fabricated by stacking a lower electrode 12, an optical absorption layer 13, an amplification layer 14 and an upper electrode 15 one after another on an insulating substrate 11.

Described specifically, the lower electrode 12 is formed by conducting desired patterning using a metal such as Cr, Al, Ta, Ti, Mo or Ni on the insulating substrate 11 made of glass, ceramic or the like. As the metal, alloys of the above-exemplified metal may be used. Other materials having conductivity can also be used. On the lower electrode 12, a-Si is deposited, as a semiconductor layer of the optical absorption layer 13, to the film thickness of 100–1000 nm by the plasma CVD method.

General conditions for depositing the above film are as follows:

Gas used and flow rate: $SiH_4$ (100%) 100 sccm

Pressure: 0.3 Torr

Substrate temperature: 250° C.

RF Power: 50 W

Examples of the film deposition method include, in addition to the above plasma CVD method, ECR method and optical CVD method. The sputtering method or vapor deposition method can also be employed.

As the optical absorption material of the optical absorption layer 13, a-Si is employed, however, it is possible to add a suitable additive to Si depending on the wavelength of the light to be detected. For attaining an improvement in the sensitivity to the shorter wavelength region, a desired amount of C, N, O or the like is added, while for the improvement of the sensitivity to the longer wavelength region, an element such as Ge may be added.

As a base material for the optical absorption layer 13, it is desired to use Si to detect the visible light range. It is also possible to use other thin-film materials such as Ge, Se, CdS, CdSe or PbS. When such a material is used, the material and preparation process, and also crystallization means should be selected in full consideration of the thermal influence which will be exerted in a subsequent crystallizing step.

Continuously on the optical absorption layer 13, an avalanche amplification layer 14 is formed using the formation method similar to that employed for the optical absorption layer. As the amplification layer 14, used is a-SiC having a larger band gap than that of the conventionally used material. It is needless to say that as the amplification layer 14, a material having a high electron formation efficiency is suited. Furthermore, it is necessary to select a material having a high $\alpha/\beta$ ratio (an electron multiplication factor/hole multiplication factor ratio) should be selected to suppress the generation of the excess noise at the time of amplification.

Furthermore, it is also necessary to select a material which has intra-film gap level as small as possible to avoid the formation of electrons from the gap level of hole-electron pairs at the time when a high electric field is applied, which is a principal cause for the dark current.

In this embodiment, a-SiC is employed as the amplification layer 14 but it is also possible to use Se, a-SiN, a-SiO, CdS and ZnS and compounds thereof. Upon selection, it should be noted that as incident light is allowed to enter from the side of the amplification layer 14, the optical absorption coefficient of the amplification layer 14 is made smaller enough compared with that of the optical absorption layer 13.

General conditions for forming a-SiC are as follows:

Gas used and flow rate: $SiH_4$ 100 sccm, $C_2H_6$ 10 sccm

Pressure: 0.5 Torr

Substrate temperature: 250° C.

RF Power: 50 W

Film thickness: 10–1000 nm

At the time of formation, the C content in the amplification layer 14 is adjusted by changing the flow rate of $C_2H_6$ gas as needed. The C/Si ratio is usable within a range of from 0.1 to 3 and it is selected according to the wavelength of the light to be detected. When a visible light range is detected, the ratio falling within a range of from 0.5 to 2 is preferred, while the band gap energy is preferably 1.5–3.5 eV.

Then, a-SiC which forms the amplification layer 14 is crystallized using an excimer laser. In addition to this, Ar laser, $CO_2$ laser, infrared flash annealing can be employed for the formation. It should however been borne in mind that the crystallization method is selected so that the heat rays are absorbed sufficiently in the amplification layer 14 to crystallize the layer, and they are absorbed only by the amplification layer 14 and do not exert influence on the optical absorption layer 13 below the amplification layer 14.

In this embodiment, the optical absorption layer 13 (a-Si layer) exists below the amplification layer. If heat rays reach the optical absorption layer and cause crystallization of a-Si, this layer cannot exhibit desired properties as the optical absorption layer 13. In the case of the excimer laser, if the film thickness of a-SiC and laser strength are set properly, it is possible to crystallize only the amplification layer 14 and maintain the optical absorption layer 13 (a-Si layer) without crystallization, because its wavelength exists within the ultraviolet region and even a-SiC having a large band gap has a sufficiently large absorption coefficient.

Typical examples of the crystallizing conditions are shown below:

Laser used: KrF

Laser strength: 50–500 $mW/cm^2$

Pulse width: 50 nsec

Pulse irradiation frequency: 1–50 times

Under the above conditions, crystallization for the amplification layer 14 (a-SiC layer) to the thickness of about 200 nm was conducted.

Figure 3:
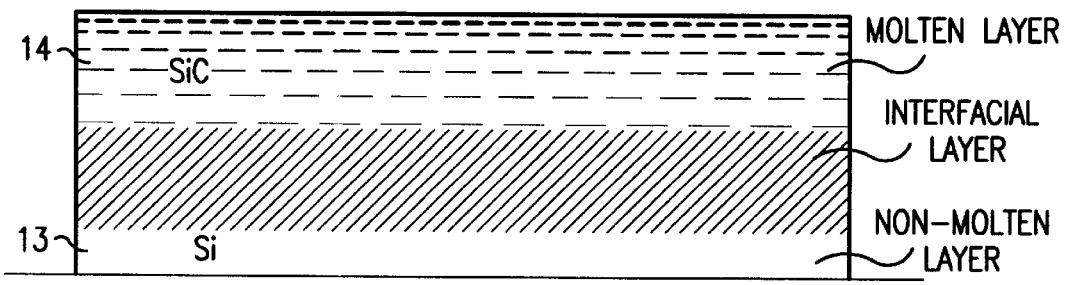
FIG. 3 is a schematic view illustrating the formation method of an interface region between the optical absorption layer and the amplification layer of the semiconductor photo detector.

The gap level (local level density) of a-SiC decreased largely from $10^{18}/cm^3$, the level before crystallization, to $10^{16}/cm^3$ as the result of the crystallization under the above conditions. In order to cope with the crystallization of the amplification layer 14 thicker than the above, a laser of a longer wavelength can be used or laser strength can be increased. It should be noted at this time that as shown in FIG. 3, when the amplification layer 14 is exposed to laser irradiated downwards, the amplification layer 14 is crystallized over the whole thickness direction and at the same time, the optical absorption layer 13 (a-Si layer), which is below the amplification layer 14, is slightly molten. By this crystallization and slight melting, C diffuses from the amplification layer 14 (a-SiC layer) and mixes in the upper layer portion of the optical absorption layer 13 (a-Si layer), thereby lowering the C concentration in the interfacial part from the amplification layer 14 toward the optical absorption layer 13, whereby the continuous content distribution of C can be obtained.

Accordingly, as shown in FIG. 1(b), even if there exists an energy gap, as shown by a dotted line, between the optical absorption layer 13 and the amplification layer 14 at the time of stacking, the band gap becomes small in the boundary region layer on the side of the optical absorption layer 13 owing to the release of H (hydrogen) from the optical absorption layer 13, while the band gap becomes large in the boundary region layer on the side of the amplification layer 14 owing to the diffusion of C, by which the energy bands on the interface between the optical absorption layer 13 and the amplification layer 14 can be made continuous and accumulation of electrons at this part can be avoided. Needless to say, no definite interface is formed so that an interfacial level which will cause a trouble is not formed at all.

In the boundary layer on the side of the optical absorption layer 13, the band gap becomes smaller owing to the release of H (hydrogen) from the optical absorption layer 13 as described above, whereby a constriction is formed. This constriction has effects for accelerating the transfer of electrons from the optical absorption layer 13 to the amplification layer 14, thereby contributing the improvement in the amplification factor.

After crystallization, it is possible to conduct various treatments, as needed, to a-SiC which is the amplification layer 14, with a view to improving its film quality. Examples of the effective treatment for use in this invention include hydrogenation treatment by the plasma CVD or ECR CVD apparatus and annealing in the forming gas ($H_2$, $N_2$). When an a-SiC layer is treated, H contained in the film is released during the crystallizing step so that in order to make up for it and to reduce the intra-film gap level, it is effective to conduct hydrogenation treatment by plasma.

As the final step, ITO or $SnO_2$ is deposited to form a transparent electrode, followed by patterning, whereby the upper electrode 15 is formed. Any material can be used for the electrode insofar as it has both a sufficient light transmitting property and small resistance. Usable examples include ultra-thin films of metals such as Al, Cr, Ta, Ti and Ni and alloys thereof, and also silicides thereof.

In this embodiment, incident light is irradiated from the side of the upper electrode 15 existing in the upper part of the device. It is also possible to irradiate incident light from the lower part of the device, using the insulating substrate 11 as a light transmitting material. At this time, the upper electrode 15 is not required to be transparent.

When reverse bias voltage is applied to the above-described semiconductor photo detector, the electric field is applied to the amplification layer 14, thereby causing avalanche amplification. The band structure at this time shows a downward monotonous inclination so that accumulation, at the interfacial part, of electrons generated by the optical irradiation can be avoided, disappearance of electrons at the interfacial part can be suppressed and a drastic increase in the amplification factor can be attained. Furthermore, the amplification layer 14 (a-SiC) has higher resistance than the optical absorption layer 13 (a-Si) has so that most of the voltage to be applied to the semiconductor photo detector is applied to the amplification layer 14, whereby the electric field of the amplification layer 14 can be heightened while the driving voltage of the semiconductor photo detector is lowered.

As the amplification layer 14, crystallized a-SiC is used so that the band gap of the amplification layer is enlarged and dark current formed by the electric field at the time when reverse bias voltage is applied can be suppressed. By crystallization, the gap level (local level density) can be reduced to $10^{16}/cm^3$ which is necessary for suppressing the dark current at the time when reverse bias voltage is applied.

Figure 4:
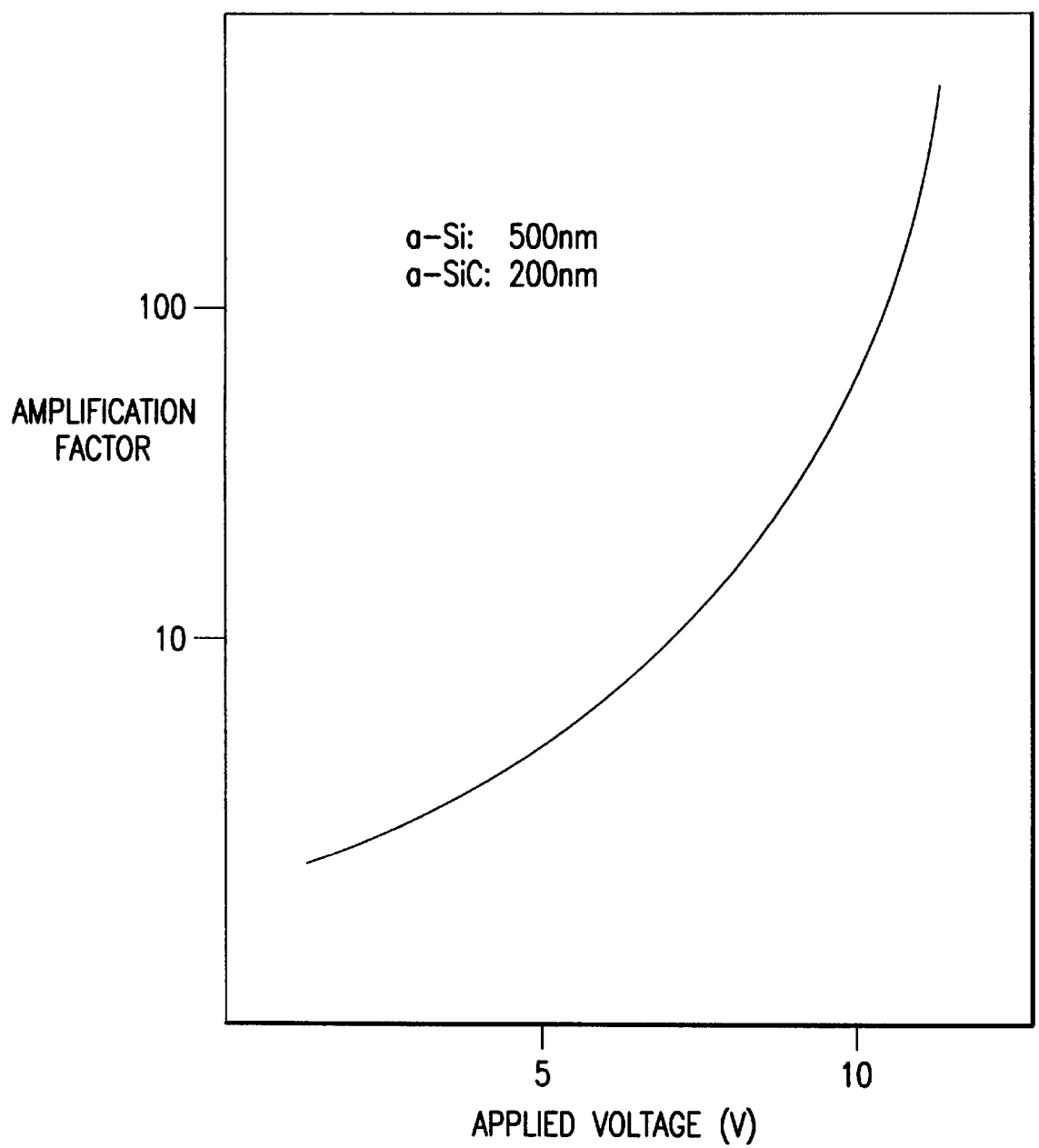
FIG. 4 is a voltage-gain characteristic diagram of the semiconductor photo detector according to this embodiment.

Concerning the semiconductor photo detector fabricated by the above-described method, one example of the characteristics in the case where the optical absorption layer 13 (a-Si) and the amplification layer 14 (a-SiC) are formed to give a film thickness of 500 nm and 200 nm, respectively is shown in FIG. 4.

As is apparent from this, the photo detector according to this embodiment has a gain of about 50 at the applied voltage of 10V, which shows an improvement in the amplification factor by one figure or more compared with the conventional one. It is of course presumed that a further improvement can attained by increasing the film thickness and applied voltage.

The dark current at the applied voltage of 20 V is 1 $nA/cm^2$ or lower, from which it is confirmed that the dark current can be lowered by two figures or more.

Embodiment 2

Figure 5:
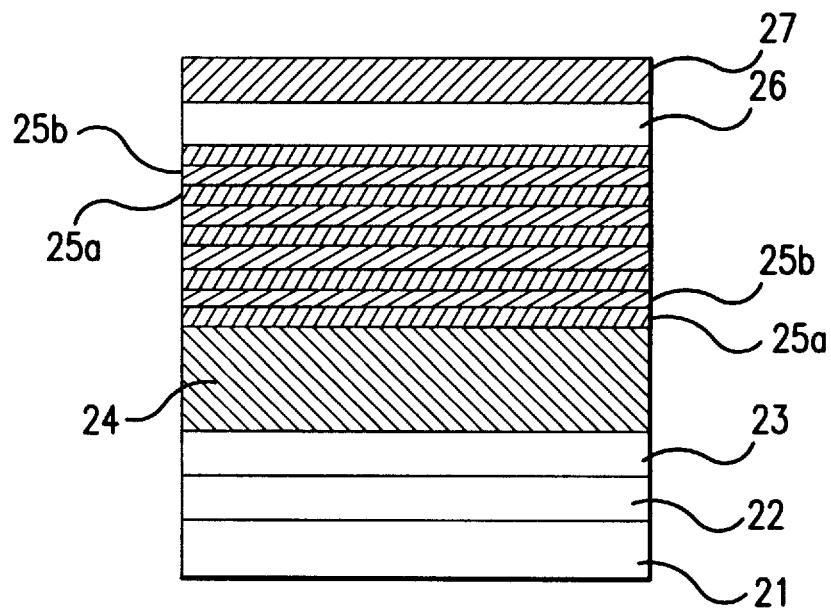
FIG. 5 is a schematic cross-sectional view illustrating the structure of the semiconductor photo detector according to another embodiment.
Figure 6:
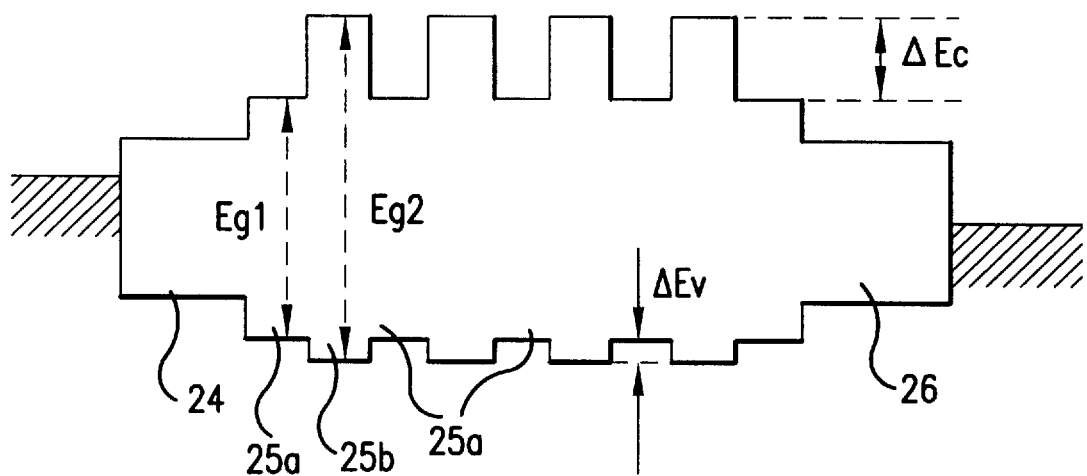
FIG. 6 is an energy band diagram illustrating the band structure of the semiconductor photo detector according to another embodiment, before exposure to laser.

A description will next be made of the second embodiment, with reference to FIGS. 5 and 6. In this embodiment, the amplification layer has a laminated structure of films different in the band gap (forbidden band width).

Described specifically, on a insulating substrate 21 made of glass, ceramic or the like, a lower electrode 22 is formed by patterning using a metal such as Cr, Al, Ta, Ti, Mo or Ni into a desired shape. Alloys of the above-exemplified metal can also be used. It is needless to say that other materials can also be used.

On the lower electrode 22, an electron-injection inhibition layer 23 is formed by the deposition of a $p^+$a-Si layer to a film thickness of 50 nm. Alternatively, it is possible to insert an insulating film as thin as 1–50 nm as the electron-injection inhibition layer. As the insulating film, generally employed $SiO_x$, $Si_xN_y$ or the like can be used.

On the electron-injection inhibition layer 23, formed is an optical absorption layer 24 made of a semiconductor layer obtained by depositing a-Si to the film thickness of 100–1000 nm by the plasma CVD method. General conditions for the deposition of the optical absorption layer 24 are as follows:

Gas employed and flow rate: SiH4 (100%) 100 sccm
Pressure: 0.3 Torr
Substrate temperature: 250° C.
RF Power: 50 W Examples of the method usable for film deposition include, in addition to the plasma method, ECR method and optical CVD method. The sputtering method or vapor deposition method can also be employed.

As the optical absorption material, a-Si is employed but it is also possible to add a suitable additive to Si depending on the wavelength of the light to be detected. For the improvement in the sensitivity to the shorter wavelength region, a desired amount of C, N, O or the like can be added, while for the improvement in the sensitivity to the longer wavelength region, it is possible to add an element such as Ge.

As a base material for the optical absorption layer 24, it is desired to use Si to detect the visible light range. It is also possible to use other thin-film materials such as Ge, Se, CdS, CdSe or PbS. When such materials are used, however, the material and formation method, and also crystallization means should be selected in full consideration of the thermal influence which will be exerted on the subsequent crystallizing step.

Continuously on the optical absorption layer 24, an amplification layer 25 is formed using the formation method similar to that employed for the optical absorption layer. This embodiment is characterized by that the amplification layer 25 is formed of an avalanche layer 25a made of a crystal substance and a barrier layer 25b, and each amplification layer is formed of a laminated layer obtained by stacking two a-SiC layers different in the band gap (forbidden band width) in plural number of times.

The reason why the amplification layer 25 is formed of a laminated layer is because in the crystallized avalanche layer 25a, an avalanche amplification effect is caused as in the amplification layer 14 according to the first embodiment and at the same time, avalanche multiplication is caused at the interfacial part by the energy corresponding to ΔEc between the avalanche layer 25a and the barrier layer 25b.

As the amplification layer 25, a material which has high electron formation efficiency is suited as described in the first embodiment. In addition, it is necessary to select a material having a high α/β ratio (an electron amplification factor/hole amplification factor ratio) to suppress the generation of excess noise at the time of amplification. It is also necessary to select a material having a small intra-film gap level to avoid the formation of electrons from the gap level of electron-hole pairs at the time when high electric field is applied.

As the material for the amplification layer 25, a-SiC is used in this embodiment. Usable examples further include Se, a-SiN, a-SiO, CdS and ZnS and compounds thereof. It is to be noted upon selection that incident light is irradiated from the side of the amplification layer 25 in this embodiment so that the optical absorption coefficient of the amplification layer 25 should be made sufficiently smaller than that of the optical absorption layer 24.

As two a-SiC films forming the amplification layer 25, the band gap value (forbidden band width) Eg1 of the avalanche layer 25a is set at 2.0 eV and that Eg2 of the barrier layer 25b is set at 3.5 eV.

Conditions for the formation of the a-SiC film are generally as follows:

Gas used and flow rate: $SiH_4$ 100 sccm, $C_2H_6$ several tens sccm

Pressure: 0.5 Torr

Substrate temperature: 250° C.

RF Power: 50 W

Film thickness: 10–1000 nm

Here, a desired band gap value can be obtained by changing the flow rate of a $C_2H_6$ gas as needed and adjusting the C content. In this embodiment, the gas flow rate for obtaining a film (avalanche layer 25a) of a forbidden band width Eg1 is set at 10 sccm and that for obtaining a film (barrier layer 25b) of a forbidden band width Eg2 is set at 200 sccm. The avalanche layer 25a and barrier layer 25b are each formed to give a film thickness of 10 nm and the barrier layers 25b are inserted between each contiguous two layers of the five avalanche layers 25a. In addition to the film thickness described above, the film thickness of the avalanche layer 25a which causes avalanche amplification can be 5 nm to 100 nm, while that of the barrier layer 25b can be 5 nm to 50 nm.

Next, the a-SiC lamination film which is the amplification layer 25 is crystallized using a laser beam. Examples of the crystallization method usable in this embodiment include, in addition to the above method, Ar laser, $CO_2$ laser and infrared flash annealing. It should however be noted that the crystallization method is selected so that heat rays are fully absorbed by the avalanche layer 25a to cause crystallization of the layer, and they are absorbed only by the avalanche layer 25a and do not exert influence on the barrier layer 25b and the optical absorption layer 24 therebelow. In this embodiment, there exists an a-Si layer (optical absorption layer 24) below the amplification layer. If heat rays reach the optical absorption layer and cause crystallization of a-Si, the optical absorption layer cannot exhibit its desired performance, so the selection of the heat rays has an important meaning.

In this embodiment, a laser having a wavelength of 350 nm within a blue light range is selected so that the absorption coefficient of the avalanche layer 25a (a-SiC of the forbidden band width Eg1) is sufficiently large and the light almost transmits the barrier layer 25b (SiC of the forbidden width band Eg2). So, if the film thickness of a-SiC and laser strength are set suitably, only the avalanche layer 25a can be crystallized and at the same time, the barrier layer 25b and optical absorption layer 24 can be maintained as they are.

The object of the formation of the amplification layer as described above is to crystallize only the avalanche layer 25a of a forbidden band width Eg1, said avalanche layer being requested to have high film quality and being a layer which causes avalanche amplification, and in addition, to maintain the interface between the avalanche layer 25a and the barrier layer 25b steep. When electrons traveling in the amplification layer 25 transfer from the layer (barrier layer 25b) of the forbidden band width Eg2 to the layer (avalanche layer 25a) of the forbidden band width Eg1, they gain, at their interfacial part, energy corresponding to ΔEc between these two layers, thereby causing avalanche amplification. Accordingly, it is necessary to give energy to electrons effectively by suppressing the diffusion of C and Si atoms between these two layers and forming a steep interface.

A typical example of the crystallizing conditions is shown below:

Laser used: wavelength 350 nm

Laser strength: 50–500 $mW/cm^2$

Pulse width: 50 nsec

Pulse irradiation frequency: 1–50 times

Under the above conditions, only the avalanche layer 25a (a-SiC layer having Eg1 of 2.0 eV) is crystallized.

The gap level density of a-SiC (avalanche layer 25a) reduced drastically from $10^{18}/cm^3$ to $10^{16}/cm^3$ by the crystallization according to the above method. For the crystallization of the avalanche layer 25a which is thicker, a laser of a longer wavelength can be used or laser strength can be increased.

It is also possible to conduct, as needed, various treatments for the improvement of the film quality of a-SiC which is the amplification layer 25. Examples of the effective treatment include hydrogenation treatment by the plasma CVD or ECR CVD apparatus and annealing in a forming gas ($H_2$, $N_3$). When the a-SiC layer is treated, hydrogenation treatment using plasma is effective for making up for H (hydrogen) which has been once contained in the film but released during the crystallization step, thereby reducing the gap level in the film.

On the amplification layer 25, a hole-injection inhibition layer 26 on which an $n^+$a-Si film has been deposited to the film thickness of 50 nm is formed. As the hole-injection inhibition layer 26, insulating films such as $SiO_x$ and $Si_xNy$ films are also usable.

On the hole-injection inhibition layer 26, formed is an upper electrode 27 obtained by depositing ITO, $SnO_2$ or the like to form a transparent electrode and then patterning. Any material can be used for the electrode insofar as it has a sufficient transmittance to the light and has low resistance. Examples include ultra thin metal coating (1–10 nm) such as Al, Cr, Ta, Ti and Ni and alloys thereof and also suicides thereof.

In this embodiment, an example of incident irradiation of light from the upper part of the semiconductor photo diode (on the side of the upper electrode 27) is shown, but it is also possible to irradiate the light incident from the lower part of the semiconductor photo diode using the insulating substrate 21 as a light transmitting material. At this time, the upper electrode 27 is not required to be transparent.

According to this embodiment, avalanche amplification is conducted in the avalanche layer 25a which corresponds to the amplification layer 14 of the first embodiment, so the similar effects to those of the first embodiment can be obtained. In addition, avalanche amplification is caused by the energy corresponding to ΔEc between the avalanche layer 25a and the barrier layer 25b at the interfacial part therebetween, which makes it possible to bring about a further improvement in the amplification factor.

Figure 7:
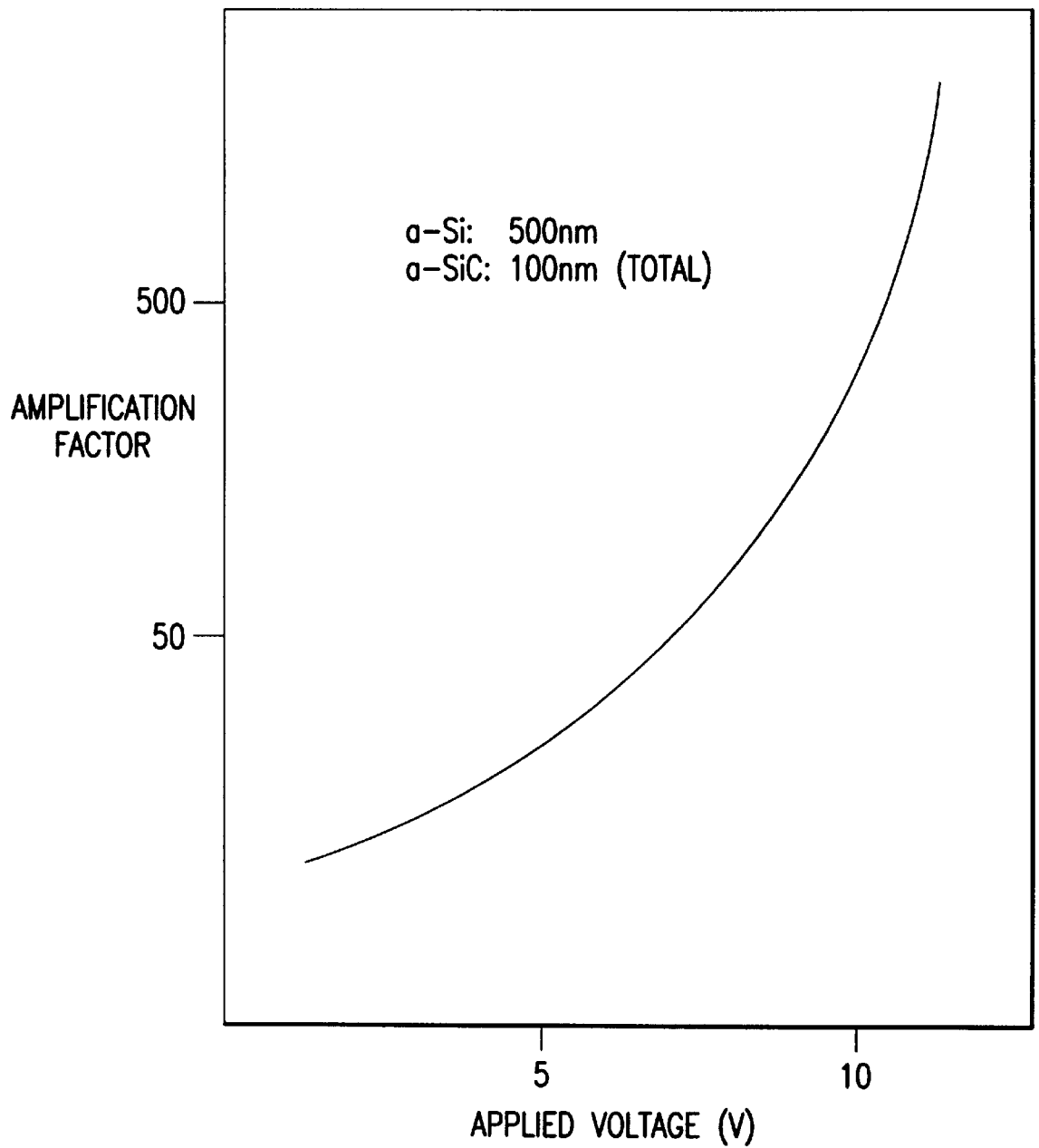
FIG. 7 is a voltage-gain characteristic diagram of the semiconductor photo detector according to another embodiment.

FIG. 7 illustrates one example of the characteristics of the semiconductor photo detector fabricated by the above method in the case where the thickness of the optical absorption layer 24 (a-Si) is set at 500 nm and that of the amplification layer 25 (a-SiC) is set at 100 nm in total. In this embodiment, the amplification layer 25 has a multilayer laminate structure composed of the avalanche layer 25a and the barrier layer 25b, whereby a higher gain can be obtained compared with the properties (FIG. 4) of the semiconductor photo detector shown in the first embodiment.

A description will next be made of specific embodiments of the semiconductor photo detector according to the present invention, which corresponds to the above-described structure (ii).

Embodiment 3

The semiconductor photo detector according to this embodiment is basically equal to that shown in FIG. 8. Described specifically, on an insulating substrate 1, a lower electrode 2, an amplification layer 3, an optical absorption layer 4 and an upper electrode 5 are stacked one after another.

First, on the insulating substrate 1 made of glass, ceramic or the like, a desired pattern is formed as the lower electrode 2 by using a metal such as Cr, Al, Ta, Ti, Mo or Ni. Further examples of the metal may include alloys of the above-exemplified metal. Other materials having good conductivity can also be used.

On the lower electrode 2, a-Si is deposited, as the first layer forming the amplification layer 3, to give a film thickness of 200 nm by using the plasma CVD method or LP CVD method, whereby a well layer 3a is formed. The well layer 31 may be deposited to the film thickness falling within a range of from 10 nm to 1000 nm. The general conditions for the deposition using LP CVD are as follows:

Gas used and flow rate: $Si_2H_6$ (100%) 100 sccm
Pressure: 0.3 Torr
Substrate temperature: 480° C.

Examples of the deposition method usable here include, in addition to the above method, ECR method, optical CVD method, sputtering method and the vapor deposition method. In this embodiment, Si is used for the well layer 3a of the amplification layer 3, but it is also possible to employ SiGe or SiC to obtain a necessary band gap value.

In the above-described deposition, the Si film forming the well layer 3a is in the amorphous condition. Without crystallization, the intra-film gap level (local level density) is $10^{17}/cm^3$ or higher. If voltage is applied for amplification, a large amount of electron-hole pairs are formed from the above gap level, resulting in large dark current, which causes a marked lowering in the SN ratio and dynamic range of the semiconductor photo detector.

As countermeasures against the above problem, it is very effective to irradiate laser light to the above-described Si film (amorphous film), thereby polycrystallizing the film. The polycrystallization to obtain a poly-Si film reduces the gap level of the Si film, whereby $10^{16}/cm^3$ or smaller which is the gap level necessary for suppressing the dark current can be obtained easily. As a result, not only the dark current in the well layer 3a can be reduced remarkably but also the mobility of electrons in the film can be improved by two figures, which make it possible to bring about a large improvement in the mean free path of electrons, thereby increasing the electric current and attaining an improvement in the amplification factor.

In the above embodiment, an excimer laser is employed upon the above-described crystallization of the amorphous Si film. As one of the merits of using the excimer laser is that because it has a short wavelength in a ultraviolet region, light is almost absorbed in the Si film and there is no thermal influence on the lower insulating substrate 1 or the like. Crystallizing conditions in this embodiment are as follows:

Laser used: KrF
Laser strength; 50–500 mW/cm$^2$
Pulse width: 50 nsec
Pulse irradiation frequency: 1–50 times Under these conditions, the well layer 3a (a-Si layer) was crystallized to give a film thickness of about 200 nm.

Next, as the second layer of the amplification layer 3, the barrier layer 3b is formed by depositing amorphous SiC through the plasma CVD method. Examples of the usable material include, in addition to SiC, SiO and SiN. Examples of the formation method include, in addition to the plasma CVD, ECR CVD, optical CVD, sputtering and vapor deposition method.

Upon film deposition of amorphous SiC, the band gap of the barrier layer 3b is formed so as to show a continuous and gradual decrease from the side of the well layer 3a by changing the composition ratio of Si and C. In other words, in the barrier layer 3b, the band gap is formed to show a continuous increase from the side of the optical absorption layer 4 to the side of the well layer 3a. The band gap at the interfacial part on the side of the well layer 3a is formed so that the value of the difference (ΔEc) of the electron conduction band at the interfacial part between the well layer 3a and the barrier layer 3b becomes larger than the value of the band gap (forbidden band width Eg) of the material forming the well layer 3a.

Owing to such structure, the electrons which have transferred from the barrier layer 3b to the well layer 3a receive the energy corresponding to the difference of the conduction band at the interfacial part (convert the potential energy to the kinetic energy) and with only this energy, avalanche amplification is caused in the well layer 3a, which makes it possible to cause a high-sensitivity amplification operation of the semiconductor photo detector.

The conventional APD which accelerates electrons by externally applied voltage, thereby causing an avalanche phenomenon, while according to the energy transfer structure of the above-described semiconductor photo detector, application of external electric field to cause an avalanche phenomenon is not required [reverse bias voltage is necessary for flattening or monotonously decreasing the energy value of the conduction band of photo carriers in the barrier layer 3b (FIG. 8(c)].

Furthermore, a polycrystalline material is used as the well layer 3a so that when reverse bias voltage is applied to the semiconductor photo device, the barrier layer 3b becomes a high resistance layer relative to the well layer 3a and the electric field is therefore hardly applied to the well layer 3a, whereby unnecessary electron-hole pairs are not formed at all and the generation of the dark current is suppressed. As a result, owing to the high mobility of the polycrystalline material, sensitivity increase can be attained.

In this embodiment, the well layer 3a is made of a poly-Si film so that the band gap (forbidden band width Eg) of the well layer is about 1.1 eV. It is important that the value of the difference ($\Delta Ec$) of the conduction band exceeds it. Accordingly, amorphous SiC is used as a material for the barrier layer 3b on the side of the well layer 3a so that the band gap value (forbidden band width Eg) becomes about 3.5 eV and the value of the difference ($\Delta Ec$) of the conduction band is designed to be about 1.6 eV.

It is desired that the band gap value at the interface of the barrier layer 3b on the side of the optical absorption layer 4 is equal to or smaller than that of the optical absorption layer 4. This is because the loss of electrons caused by the energy barrier at this part can be prevented at the time when the electrons transfer from the optical absorption layer 4 to the barrier layer 3b. In this embodiment, amorphous Si is used as the optical absorption layer 4, which will be described later, so that the band gap value in this layer becomes about 1.7 eV. So, the band gap value of the barrier layer 3b is allowed to change successively from 3.5 eV on the side of the well layer 3a to 1.7 eV on the side of the optical absorption layer 4.

Specific conditions for the formation of the barrier layer 3b according to this embodiment are as follows:

Gas used and the flow rate: $SiH_4$ 10–100 sccm $C_2H_6$ 0–200 sccm

Pressure: 0.5 Torr

Substrate temperature: 250° C.

RF Power: 50 W

Film thickness: 10–1000 nm.

The C content is adjusted by changing the flow rate of a $C_2H_6$ gas as needed. In this way, during film deposition, the gas flow rate is changed continuously.

After the formation of the amplification layer 3 composed of the well layer 3a and the barrier layer 3b, a-Si is deposited as an optical absorption material, whereby the optical absorption layer 4 is formed. In this embodiment, as the optical absorption material, a-Si is employed, but it is also possible to add a suitable additive to Si depending on the wavelength of the light to be detected. For example, in order to increase the sensitivity to the shorter wavelength region, a desired amount of C, N, O or the like is added, while for increasing the sensitivity to the longer wavelength region, an element such as Ge is added.

As the base material for the optical absorption material, it is desired to use Si in the case where a visible light range is detected, but other thin film materials such as Ge, Se, CdS, CdSe or PbS can also be employed.

As the final step, ITO, $SnO_2$ or the like which is a light transmitting material is deposited for film formation, followed by patterning whereby the upper electrode 5 is formed as a transparent electrode. Any electrode material can be used insofar as it has both a sufficient light transmittance and small resistance. Examples include ultra thin films (1–10 nm) of metals such as Al, Cr, Ta, Ti and Ni and alloys thereof. Silicides thereof can also be used.

Figure 10:
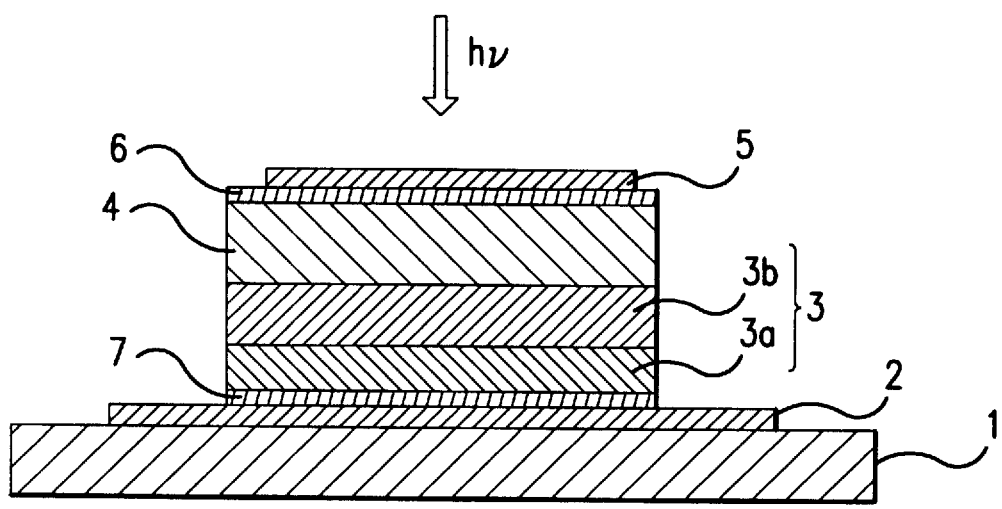
FIG. 10 is a schematic cross-sectional view illustrating the structure of the semiconductor photo detector according to another embodiment.

As illustrated in FIG. 10, between the optical absorption layer 4 and the transparent electrode 5 and the amplification layer 3 and the electrode 2, a p layer 6 and an n layer 7 each made of amorphous or polycrystalline Si are inserted, as needed, as an electron blocking layer and a hole blocking layer, respectively, whereby effects for reducing the dark current can be obtained. Instead of these p layer 6 and n layer 7, thin insulation films of 1–100 nm can be inserted to bring about similar effects.

In this embodiment, incident light is irradiated from the upper part of the semiconductor photo detector, but it is possible to form the insulating substrate 1 using a light transmitting material and to irradiate the incident light from the lower part of the semiconductor photo detector. In this case, it is not necessary to form the upper electrode 5 from a light transmitting material.

Using the above-described method, a semiconductor photo detector which has a film thickness of 500 nm in the optical absorption layer 4 (a-Si film), and 200 nm each in the well layer 3a and the barrier layer 3b of the amplification layer 3 was fabricated and its characteristics were measured. As a result, it has about 50 gains at the applied voltage of 10V, showing an improvement in the amplification factor by at least one figure compared with the conventional embodiment. It is presumed that a further improvement can be obtained by increasing the film thickness and applied voltage. The dark current at the applied voltage of 20 V is 1 $nA/cm^2$ or lower and it has been confirmed that the dark current lowered by two figures or more.

Embodiment 4

Figure 11A:
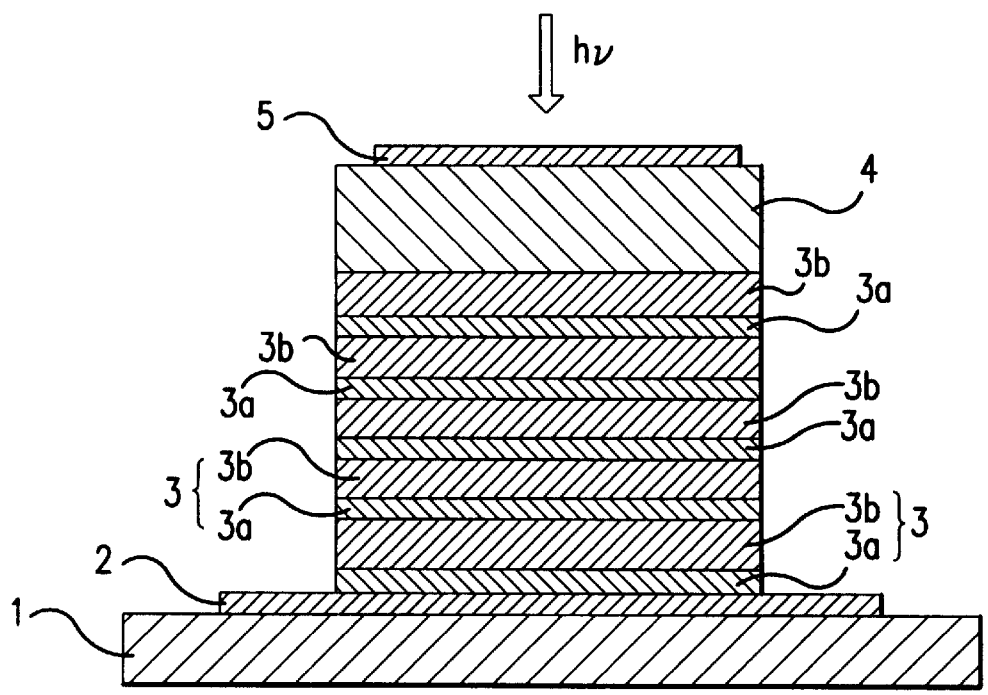
FIG. 11(a) is a schematic cross-sectional view illustrating the structure of the super-lattice employing semiconductor photo detector according to another embodiment, and 11(b) is an energy band diagram illustrating the band structure of this semiconductor photo detector at the time when no voltage is applied.
Figure 11B:
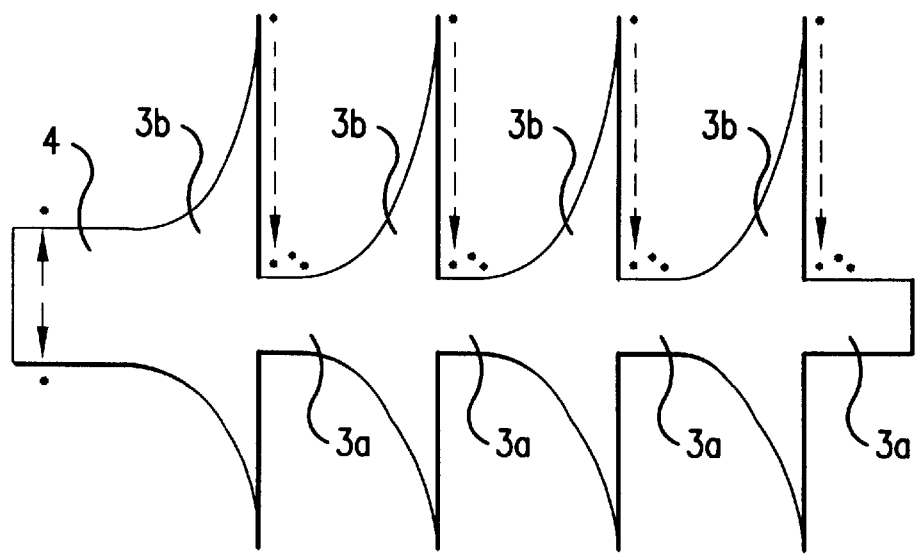
Figure 12A:
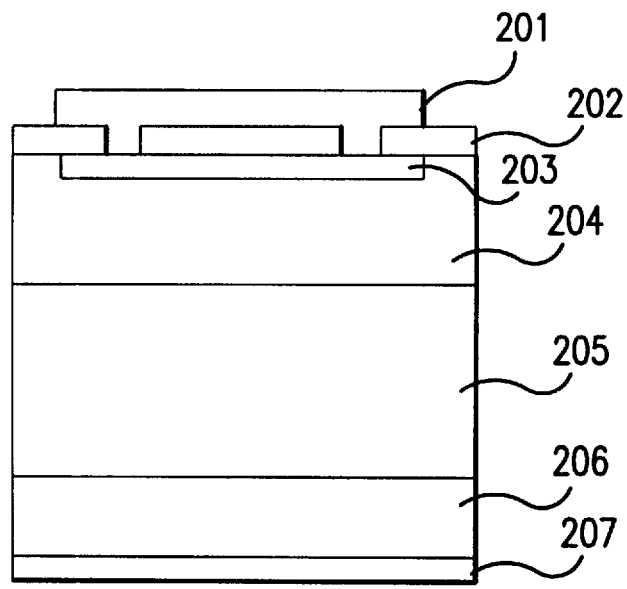
FIG. 12(a) is a schematic cross-sectional view illustrating the structure of a conventional single crystal Si APD, 12(b) is an energy band diagram illustrating the band structure of this single crystal Si APD at the time when no voltage is applied, and 12(c) is an energy band diagram illustrating the band structure of this single crystal Si APD at the time when reverse bias is applied.
Figure 12B:
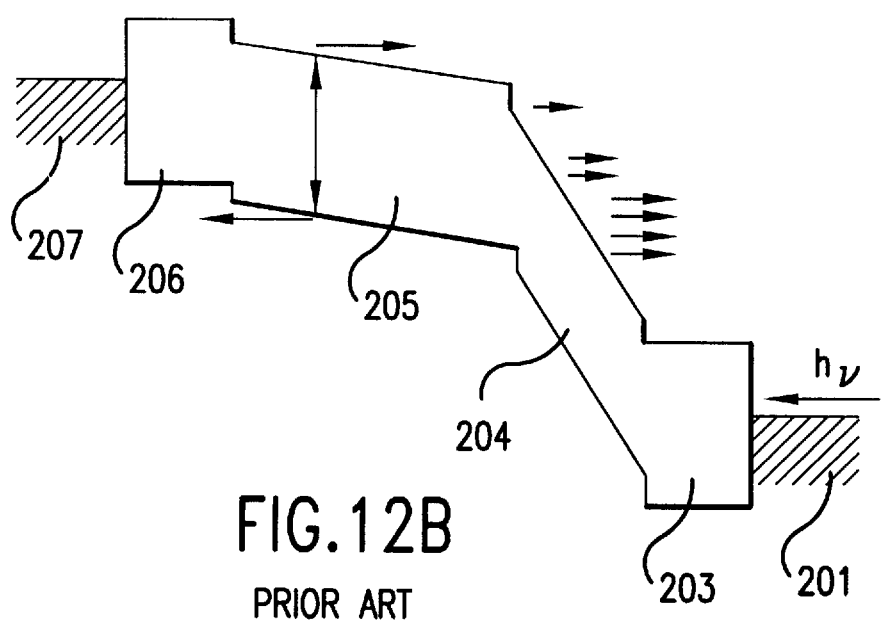
Figure 13A:
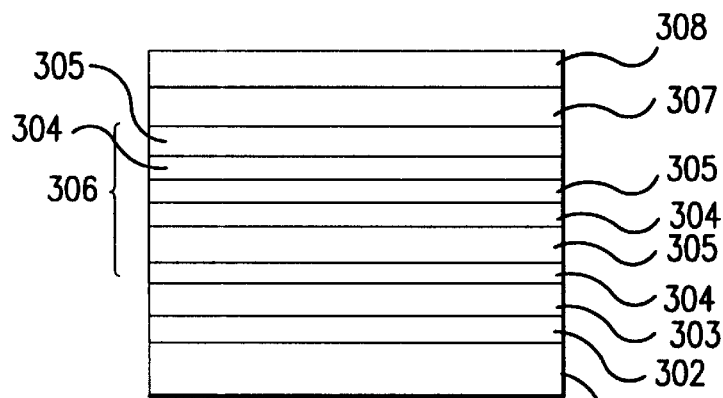
FIG. 13(a) is a schematic cross-sectional view illustrating the structure of a conventional amorphous Si-base super-lattice APD, 13(b) is an energy band diagram illustrating the band structure of this amorphous Si-base super-lattice APD at the time when no voltage is applied, and 14(c) is an energy band diagram illustrating the band structure of this amorphous Si-base super-lattice at the time when reverse bias is applied.
Figure 13B:
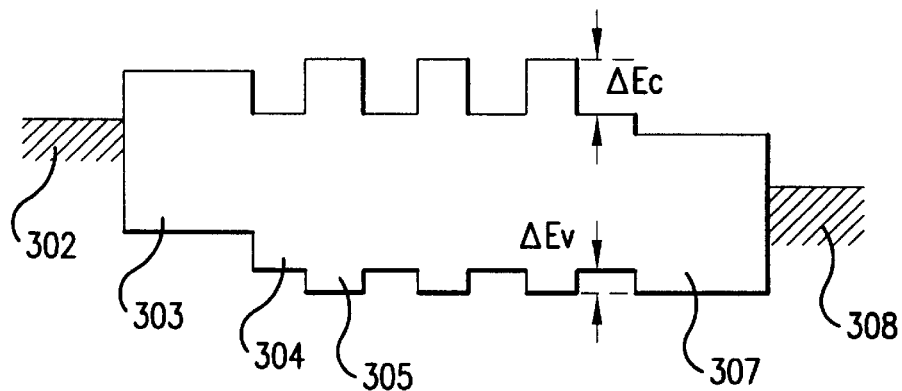
Figure 13C:
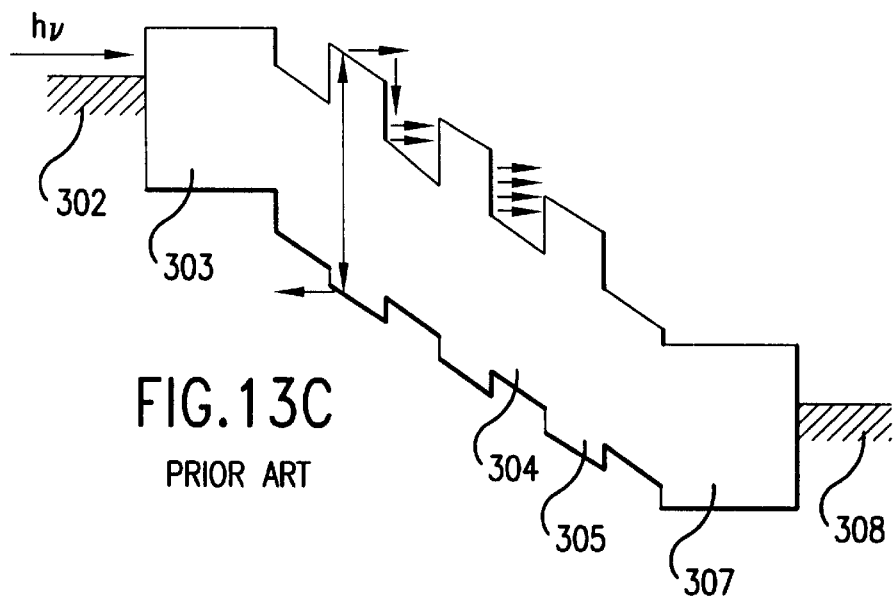
Figure 14A:
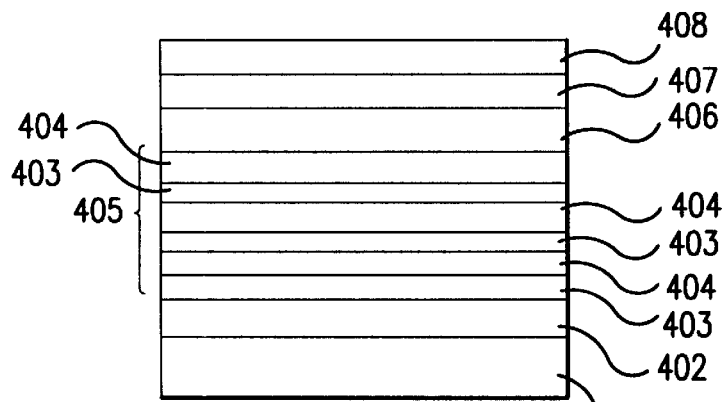
FIG. 14(a) is a schematic cross-sectional view illustrating the structure of a conventional amorphous Si-base graded super-lattice APD, 14(b) is an energy band diagram illustrating the band structure of this amorphous Si-base graded super-lattice APD at the time when no voltage is applied, and 14(c) is an energy band diagram illustrating the band structure of this amorphous Si-base graded super-lattice at the time when reverse bias is applied.
Figure 14B:
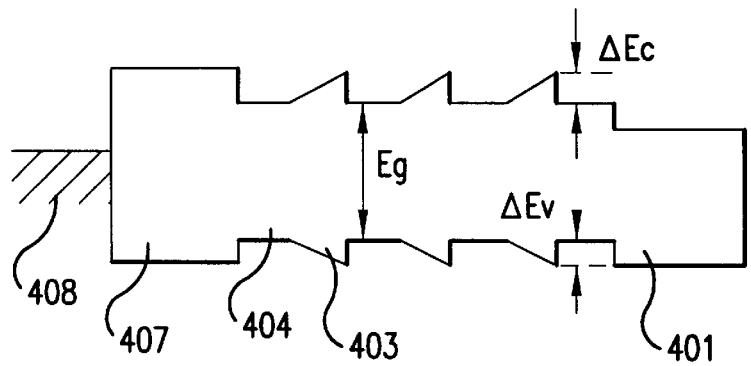
Figure 14C:
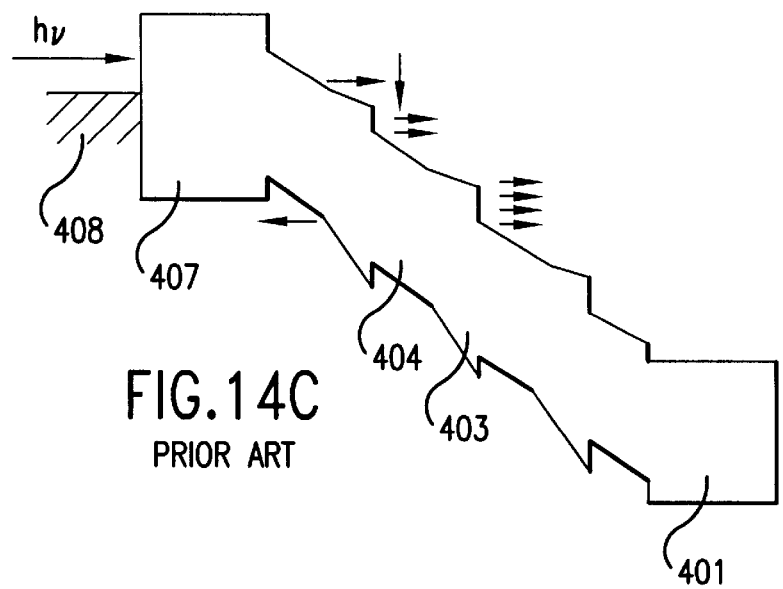

A description will next be made of a semiconductor photo detector according to the fourth embodiment of the invention, with reference to FIG. 11. FIG. 11(a) illustrates a basic constitution of the semiconductor photo detector which is similar to that of Embodiment 3 except for the amplification layer. FIG. 11(b) is a schematic view illustrating an energy band structure of the semiconductor photo detector at the time when no voltage is applied.

With a view to bringing about further improvement in the gain in the constitution shown in Embodiment 3, the amplification layer 3 according to this embodiment is designed to have a multilayer laminate structure of super lattice obtained by stacking plural pairs, each pair formed of a well layer 3a and a barrier layer 3b. As described in Embodiment 3, from the difference in the energy of the conduction band (band offset) at the interfacial part between the well layer 3a and the barrier layer 3b, which form the amplification layer as a pair, electrons receive energy and cause an avalanche amplification phenomenon in the well layer 3a. Accordingly, it becomes possible to heighten the sensitivity further by changing the basic structure to the multilayer lamination.

The multilayer laminate structure is formed by stacking the amplification layer 3 composed of five layers, each layer being formed of the well layer 3a and the barrier layer 3b, which is shown in Embodiment 3. The well layer 3a and the barrier layer 3b are deposited continuously by using the plasma CVD. Although it is also possible to form the well layer 3a and the barrier layer 3b by the different methods, it is desired to conduct continuous formation by the same method as in this embodiment, because impurities tend to be mixed in the interface between these two layers, if different methods are employed.

Conditions for the film deposition of the well layer 3a by the plasma CVD are as follows:

Gas used and flow rate: $SiH_4$ (100%) 100 sccm

Pressure: 0.3 Torr

Substrate temperature: 250° C.

RF Power: 50 W

Film thickness: 20 nm

On the well layer 3a, an SiC layer is formed to give a film thickness of 100 nm while a band gap is changed continuously under the conditions similar to those for the barrier layer 3b described in Embodiment 3, whereby the amplification layer 3 is formed. Then five amplification layers 3 each composed of the well layer 3a and the barrier layer 3b are deposited continuously, whereby a multilayer laminate structure is obtained.

This multilayer laminate structure is then crystallized to effect the sensitivity increase and the dark current reduction as shown in Embodiment 3. It should be noted that different from Embodiment 3, crystallized is a laminate structure and because of the lamination, the Si film of the well layer 3a is formed of an amorphous film containing hydrogen.

In this embodiment, the film thickness of the amplification layer having a multilayer laminate structure is about 1 μm in total so that when a laser of short-wavelength light is used, as in the crystallization method shown in Embodiment 3, optical absorption occurs only in the surface layer portion of the film and crystallization of the whole laminated film cannot be conducted. Examples of the method for crystallization include the lamp annealing method and furnace annealing method in which crystallization is conducted using the light of a longer wavelength such as blue-color laser or infrared laser and conducted in a high-temperature atmosphere, respectively. In this embodiment, flash lamp annealing using heat rays is employed.

As described above, a large amount of hydrogen is contained in the Si film of the well layer 3a. If crystallization is conducted by directly exposure to high energy, bumping of intra-film hydrogen occurs, resulting in the formation of many openings in the film. To avoid this, pre-annealing is conducted at low energy for dehydrogenation prior to the crystallization of the well layer 3a.

Pre-annealing conditions for the dehydrogenation are as follows:

Lamp power: 100 W (gradual heating)

Irradiation time: 1 sec

Irradiation frequency: once.

Annealing conditions subsequent to the pre-annealing for dehydrogenation are as follows:

Lamp power: 300 W

Irradiation time: 0.1 sec

Irradiation frequency: 5–10 times.

Under the above conditions, the crystallization for the amplification layer (having a film thickness of about 1 μm) having a multilayer laminate structure was conducted.

The other layers were formed as shown in Embodiment 3.

Embodiment 5

Figure 9:
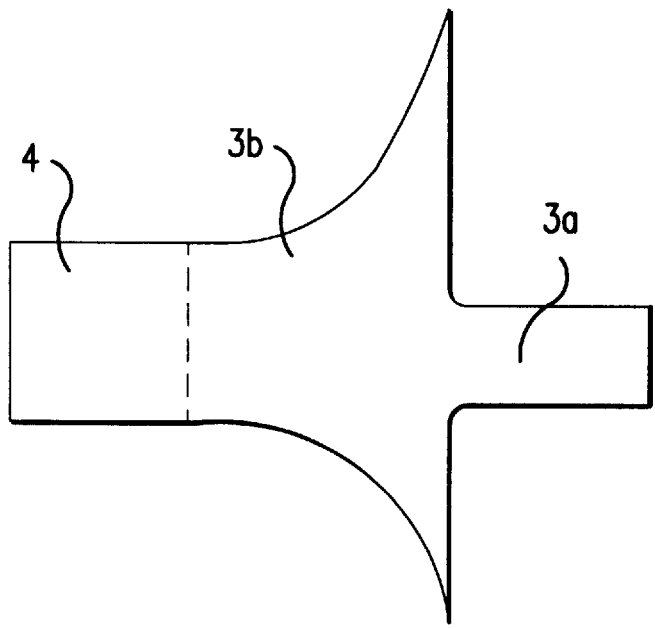
FIG. 9 is an energy band diagram illustrating the band structure, at the time when no voltage is applied, of the semiconductor photo detector in which the well layer and the barrier layer have been crystallized.

In the semiconductor photo detector according to Embodiment 5, the structure and the formation method of each layer are similar to those of Embodiment 4 except for the crystallization step of the well layer 3a. In Embodiment 4, blue laser light is employed as a crystallization means. According to the crystallization step shown in Embodiment 4, the whole multilayer laminate structure is molten and crystallized so that diffusion of a small amount of an element (C in this case) contained as an additive in the barrier layer 3b occurs at the interfacial part between the well layer 3a and the barrier layer 3b and the band offset part at the interfacial part between the well layer 3a and the barrier layer 3b has acquired a somewhat gently-sloping structure (the structure of the energy band showing a continuous change) as shown in FIG. 9.

In the actual operation, the difference (ΔEc) of the conduction band at the interface between the well layer 3a and the barrier layer 3b is sufficiently large relative to the band gap (forbidden band width Eg) of the well layer 3a so that an avalanche phenomenon can be caused only by this energy without any problem, and as another merit, as described above, a surface level which otherwise becomes a recombination center almost disappears. When electrons which have transferred from the barrier layer 3b to the well layer 3a receive, at the interfacial part therebetween, the energy corresponding to the difference of the conduction band (potential energy is converted to the kinetic energy), it is preferred to steeply change the energy band at the interfacial part to suppress the loss of the energy at this time to the minimum.

So, in Embodiment 5, with a view to suppressing the loss to the minimum and to cause a steep change, a blue laser light having a wavelength of 350 nm was used as a light source for crystallization. According to the crystallization step by the blue laser light, light is absorbed by the material of a narrow band gap which forms the well layer 3a but it transmits through the interfacial part which exists between the well layer 3a and the barrier layer 3b and has a large band gap so that only the well layer 3a can be crystallized. It is therefore possible to suppress the diffusion of C from the interfacial part on the side of the barrier layer 3b and form a steep interface.

Embodiment 6

In the semiconductor photo detector according to Embodiment 6, the structure and the formation method of each layer are similar to those of Embodiment 4 except for the film thickness of the whole multilayer laminate structure. Described specifically, the well layer 3a and the barrier layer 3b are each formed to the film thickness of 20 nm and the whole multilayer laminate structure is formed to the thickness of 200 nm. It is preferred to set the film thickness of the amplification layer 3 composed of the well layer 3a and the barrier layer 3b as thick as possible to cause an avalanche phenomenon of electrons by the electric field. The high amplification factor can however be obtained even when the semiconductor photo detector has the above film thickness (the film thickness of the whole multilayer laminate structure: 200 nm).

In each Embodiment 4 and Embodiment 5, the total film thickness of the multilayer laminate structure was as thick as about 1 μm so crystallization means using ultraviolet light could not be employed. In this Embodiment, however, crystallization of the well layer 3a was conducted using ultraviolet rays, similar to Embodiment 3. Conditions in the crystallization step are similar to those shown in Embodiment 3.

For the thin multilayer laminate structure as shown in this Embodiment, crystallization means using lamp annealing or blue laser as described in Embodiments 4 and 5 can be employed.

What is claimed is:

1. A semiconductor photo detector comprising a pair of electrodes wherein at least one of said electrodes has a light transmitting property, and between said pair of electrodes, an optical absorption layer which generates photo carriers, receiving light and an amplification layer which amplifies the photo carriers formed by said optical absorption layer, wherein said amplification layer is formed of a crystal substance obtained by crystallizing an amorphous film after stacking the film, thereby adjusting band gaps of the optical absorption layer and the amplification layer so that energy bands at an interface between the optical absorption layer and the amplification layer are continuous.

2. A semiconductor photo detector according to claim 1, wherein the crystal substance forming said amplification layer is a single crystal substance, micro-crystal substance or polycrystalline substance.

3. A semiconductor photo detector comprising a pair of electrodes wherein at least one of said electrodes has a light transmitting property, and between said pair of electrodes, an optical absorption layer which generates photo carriers, receiving light and an amplification layer which amplifies the photo carriers formed by the optical absorption layer, wherein:

said amplification layer is formed of a barrier layer having a band gap larger than that of said optical absorption layer and a well layer stacked contiguously on said barrier layer, said well layer being formed of a crystal substance obtained by crystallizing an amorphous film after stacking the film by which, at the interface with said barrier layer, an energy value of the conduction band of said photo carriers is lower than that in the barrier layer, and a difference in the energy value of the conduction band of said photo carriers between said well layer and said barrier layer is larger than the band gap between the valence band and conduction band of said well layer, wherein said semiconductor photo detector is constructed so that the band gap in said barrier layer shows an increase from the value not higher than the band gap value of said optical absorption layer in the direction from the side of said optical absorption layer toward said well layer.

4. A semiconductor photo detector according to claim 3, wherein said crystal substance forming said well layer is a single crystal substance, micro-crystal substance or polycrystalline substance.

5. A semiconductor photo detector according to claim 3, wherein said well layer is formed by stacking polycrystalline Si, polycrystalline SiC or polycrystalline SiGe.

6. A semiconductor photo detector according to claim 3, wherein the local level density in the energy gap in said well layer is $10^{16}/cm^3$ or lower.

7. A semiconductor photo detector according to claim 3, which is constructed so that the energy value of the conduction band of said photo carriers in said barrier layer shows a monotonous decrease toward the advancing direction of said photo carriers at the time when drive voltage is applied between said pair of electrodes.

8. A semiconductor photo detector according to claim 7, wherein said barrier layer is formed of at least one material selected from the group consisting of $Si_xC_y$, $Si_xN_y$ and $Si_xO_y$ (x and y each standing for any integer) and is constructed so that the composition ratio determined by said x and y is changed continuously from said optical absorption layer toward said well layer.

9. A semiconductor photo detector according to claim 3, wherein said barrier layer is formed of at least one material selected from the group consisting of $Si_xC_y$, $Si_xN_y$ and $Si_xO_y$ (x and y each standing for any integer).

10. A semiconductor photo detector according to claim 3, wherein said amplification layer is formed of a plurality of combinations of said barrier layer and said well layer between said pair of electrodes.

* * * * *